(12) United States Patent
Shimizu

(10) Patent No.: US 7,910,285 B2
(45) Date of Patent: Mar. 22, 2011

(54) POSITIVE RESIST COMPOSITION FOR IMMERSION EXPOSURE AND METHOD OF FORMING RESIST PATTERN

(75) Inventor: Hiroaki Shimizu, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 272 days.

(21) Appl. No.: 12/162,080

(22) PCT Filed: Nov. 16, 2006

(86) PCT No.: PCT/JP2006/322862
§ 371 (c)(1),
(2), (4) Date: Jul. 24, 2008

(87) PCT Pub. No.: WO2007/086181
PCT Pub. Date: Aug. 2, 2007

(65) Prior Publication Data
US 2009/0042130 A1    Feb. 12, 2009

(30) Foreign Application Priority Data

Jan. 26, 2006 (JP) .................. 2006-018087

(51) Int. Cl.
G03F 7/004 (2006.01)
G03F 7/30 (2006.01)

(52) U.S. Cl. .................. 430/270.1; 430/326; 430/910

(58) Field of Classification Search ............ 430/270.1, 430/326, 910
See application file for complete search history.

(56) References Cited

U.S. PATENT DOCUMENTS

| 5,945,517 | A | 8/1999 | Nitta et al. | |
| 6,013,416 | A | 1/2000 | Nozaki et al. | |
| 6,180,313 | B1 | 1/2001 | Yukawa et al. | |
| 6,495,307 | B2 * | 12/2002 | Uetani et al. | 430/270.1 |
| 2001/0046641 | A1 * | 11/2001 | Uetani et al. | 430/270.1 |
| 2005/0031984 | A1 * | 2/2005 | Takata et al. | 430/270.1 |
| 2006/0040203 | A1 | 2/2006 | Kodama et al. | |

FOREIGN PATENT DOCUMENTS

| JP | H09-208554 | 8/1997 |
| JP | H10-161313 | 6/1998 |
| JP | H11-035551 | 2/1999 |
| JP | H11-035552 | 2/1999 |
| JP | H11-035573 | 2/1999 |
| JP | H11-322707 | 11/1999 |
| JP | 2005-023234 | 1/2005 |
| JP | 2005-266766 | 9/2005 |
| JP | 2005-316259 | 11/2005 |
| WO | WO 2004/074242 | 9/2004 |

OTHER PUBLICATIONS

Hoffangle et al., "Liquid immersion deep-ultraviolet interferometric lithography", Journal of Vacuum Science & Technology B, vol. 17, No. 6, pp. 3306-3309, (1999).

Switkes et al., "Immersion lithography at 157nm", Journal of Vacuum Science & Technology B, vol. 19, No. 6, pp. 2353-2356, (2001).

Switkes et al., "Resolution Enhancement of 157nm Lithography by Liquid Immersion", Proceedings of SPIE, vol. 4691, pp. 459-465, (2002).

International Search Report in connection with corresponding PCT application No. PCT/JP2006/322862, dated Dec. 19, 2006.

* cited by examiner

*Primary Examiner* — John S Chu
(74) *Attorney, Agent, or Firm* — Knobbe, Martens, Olson & Bear, LLP

(57) ABSTRACT

A positive resist composition for immersion exposure including a resin component (A) which has an acid dissociable dissolution inhibiting group and exhibits increased alkali solubility under action of acid and an acid-generator component (B) which generates acid upon exposure, the resin component (A) including a structural unit (a1) derived from an acrylate ester having an acid dissociable, dissolution inhibiting group and a structural unit (a3) derived from an acrylate ester having a polar group-containing aliphatic hydrocarbon group, the amount of the structural unit (a3) based on the combined total of all structural units constituting the resin component (A) being 3 to 12 mol %.

4 Claims, 1 Drawing Sheet

POSITIVE RESIST COMPOSITION FOR IMMERSION EXPOSURE AND METHOD OF FORMING RESIST PATTERN

RELATED APPLICATIONS

This application is the U.S. National Phase filing under 35 U.S.C. §371 of PCT/JP2006/322862, filed Nov. 16, 2006, which designated the United States and was published in a language other than English, which claims priority under 35 U.S.C. §119(a)-(d) to Japanese Patent Application No. 2006-018087, filed Jan. 26, 2006. The contents of these applications are incorporated herein by reference in their entireties.

TECHNICAL FIELD

The present invention relates to a resist composition for use in immersion exposure (immersion lithography), and a method of forming a resist pattern.

BACKGROUND ART

Lithography methods are widely used in the production of microscopic structures in a variety of electronic devices such as semiconductor devices and liquid crystal devices, and ongoing miniaturization of the structures of these devices has lead to demands for further miniaturization of the resist patterns used in these lithography processes. With current lithography methods, using the most up-to-date ArF excimer lasers, fine resist patterns with a line width of approximately 90 nm are able to be formed, but in the future, even finer pattern formation will be required.

In order to enable the formation of these types of ultra fine patterns of less than 90 nm, the development of appropriate exposure apparatus and corresponding resists is the first requirement.

With respect to resists, chemically amplified resists, which enable high levels of resolution to be achieved, are able to utilize a catalytic reaction or chain reaction of an acid generated by irradiation, exhibit a quantum yield of 1 or greater, and are capable of achieving high sensitivity, are attracting considerable attention, and development of these resists is flourishing.

Until recently, polyhydroxystyrene (PHS) or PHS-based resins in which the hydroxyl groups have been protected with acid dissociable, dissolution inhibiting groups, which exhibit a high degree of transparency relative to a KrF excimer laser (248 nm), and resins that contain structural units derived from (meth)acrylate esters within the principal chain (acrylic resins) in which the carboxy group is protected with an acid dissociable, dissolution inhibiting group, which exhibit a high degree of transparency relative to an ArF excimer laser (193 nm), have been used as the base resin of chemically amplified resists. Here, the term "(meth)acrylate ester" is a generic term that includes either or both of the acrylate ester having a hydrogen atom bonded to the α-position and the methacrylate ester having a methyl group bonded to the α-position.

Examples of known acid dissociable, dissolution inhibiting groups include acetal groups such as ethoxyethyl groups, tertiary alkyl groups such as tert-butyl groups, as well as tert-butoxycarbonyl groups and tert-butoxycarbonylmethyl groups. Furthermore, structural units derived from tertiary ester compounds of (meth)acrylic acid, such as 2-alkyl-2-adamantyl (meth)acrylates, are widely used as the structural units containing an acid dissociable, dissolution inhibiting group within the resin component of conventional ArF resist compositions, as disclosed in Patent Document 1 listed below.

On the other hand, with respect to the exposure apparatus, techniques such as shortening the wavelength of the light source used, and increasing the diameter of the lens aperture (NA) (namely, increasing NA) are common. For example, for a resist resolution of approximately 0.5 μm, a mercury lamp for which the main spectrum is the 436 nm g-line is used, for a resolution of approximately 0.5 to 0.30 μm, a similar mercury lamp for which the main spectrum is the 365 nm i-line is used, for a resolution of approximately 0.3 to 0.15 μm, 248 nm KrF excimer laser light is used, and for resolutions of approximately 0.15 μm or less, 193 nm ArF excimer laser light is used. In order to achieve even greater miniaturization, the use of $F_2$ excimer laser (157 nm), $Ar_2$ excimer laser (126 nm), extreme ultraviolet radiation (EUV: 13 nm), electron beam (EB), and X-ray and the like is also being studied.

However, shortening the wavelength of the light source requires a new and expensive exposure apparatus. Furthermore, if the NA value is increased, since the resolution and the depth of focus exist in a trade-off type relationship, even if the resolution is increased, a problem arises in that the depth of focus is lowered.

Against this background, a method known as immersion exposure (immersion lithography) has been reported (for example, see Non-Patent Documents 1 to 3). In this method, exposure (immersion exposure) is conducted in a state where the region between the lens and the resist layer formed on a wafer, which has conventionally been filled with air or an inert gas such as nitrogen, is filled with a solvent (a immersion medium) that has a larger refractive index than the refractive index of air.

According to this type of immersion exposure, it is claimed that higher resolutions equivalent to those obtained using a shorter wavelength light source or a larger NA lens can be obtained using the same exposure light source wavelength, with no lowering of the depth of focus. Furthermore, immersion exposure can be conducted using existing exposure apparatus. As a result, it is expected that immersion exposure will enable the formation of resist patterns of higher resolution and superior depth of focus at lower costs. Accordingly, in the production of semiconductor devices, which requires enormous capital investment, immersion exposure is attracting considerable attention as a method that offers significant potential to the semiconductor industry, both in terms of cost and in terms of lithography properties such as resolution. Currently, water is mainly used as the immersion medium for immersion lithography.

[Patent Document 1]
Japanese Unexamined Patent Application, First Publication No. Hei 10-161313
[Non-Patent Document 1] Journal of Vacuum Science & Technology B (U.S.), 1999, vol. 17, issue 6, pp. 3306 to 3309.
[Non-Patent Document 2] Journal of Vacuum Science & Technology B (U.S.), 2001, vol. 19, issue 6, pp. 2353 to 2356.
[Non-Patent Document 3] Proceedings of SPIE (U.S.), 2002, vol. 4691, pp. 459 to 465.

DISCLOSURE OF INVENTION

Means to Solve the Problems

However, many factors associated with immersion exposure remain unknown, and the formation of an ultra fine resist pattern of a level suitable for actual use remains problematic. For example, in immersion lithography, as described above, the immersion medium comes in contact with the resist film and the lens. As a result, lithography properties may be adversely affected by elution of a substance contained in the resist into the immersion medium, which cause degeneration of the resist film and lowering of the performance thereof, local change in the refractive index of the immersion medium caused by the eluted substance, and staining of the lens surface by the eluted substance. Therefore, problems are likely to occur including deterioration in the sensitivity, formation of T-top shaped resist patterns, roughening of the surface of the resist pattern, or swelling of the resist pattern. According to the studies of the present inventors, the elution of a substance markedly occurs when an acrylic resin having an acetal group as an acid dissociable, dissolution inhibiting group is used.

As a technique for suppressing the elution of a substance, improving the resistance of the resist film to the immersion medium (immersion medium resistance) can be considered. Currently, since aqueous solvent such as water is mainly considered as the immersion medium, it is presumed that enhancing the hydrophobicity of the resist film is effective in improving the resistance to the immersion medium.

However, changing the composition of the resist for enhancing the hydrophobicity of the resist film generally results in deterioration of the lithography properties. Therefore, achieving both of suppression of elution of a substance and lithography properties is difficult.

The present invention takes the above circumstances into consideration, with an object of providing a resist composition for immersion exposure and method of forming a resist pattern, which can suppress elution of a substance, and also exhibits excellent lithography properties.

Means to Solve the Problems

For solving the above-mentioned problems, the present inventors propose the following aspects.

Specifically, a first aspect of the present invention is a positive resist composition for immersion exposure including a resin component (A) which has acid dissociable, dissolution inhibiting groups and exhibits increased alkali solubility under action of acid and an acid-generator component (B) which generates acid upon exposure, the resin component (A) including a structural unit (a1) derived from an acrylate ester having an acid dissociable, dissolution inhibiting group and a structural unit (a3) derived from an acrylate ester having a polar group-containing aliphatic hydrocarbon group, the amount of the structural unit (a3) based on the combined total of all structural units constituting the resin component (A) being 3 to 12 mol %.

Further, a second aspect of the present invention is a method of forming a resist pattern, including: applying a positive resist composition for immersion exposure of the first aspect to a substrate to form a resist film on the substrate; subjecting the resist film to immersion exposure; and developing the resist film to form a resist pattern.

In the present description and claims, the term "structural unit" refers to a monomer unit that contributes to the formation of a resin component (polymer).

The term "exposure" is used as a general concept that includes irradiation with any form of radiation.

EFFECT OF THE INVENTION

According to the present invention, there are provided a resist composition for immersion exposure and method of forming a resist pattern, which can suppress elution of a substance, and also exhibits excellent lithography properties.

BEST MODE FOR CARRYING OUT THE INVENTION

<<Positive Resist Composition for Immersion Exposure>>

Figure 1:
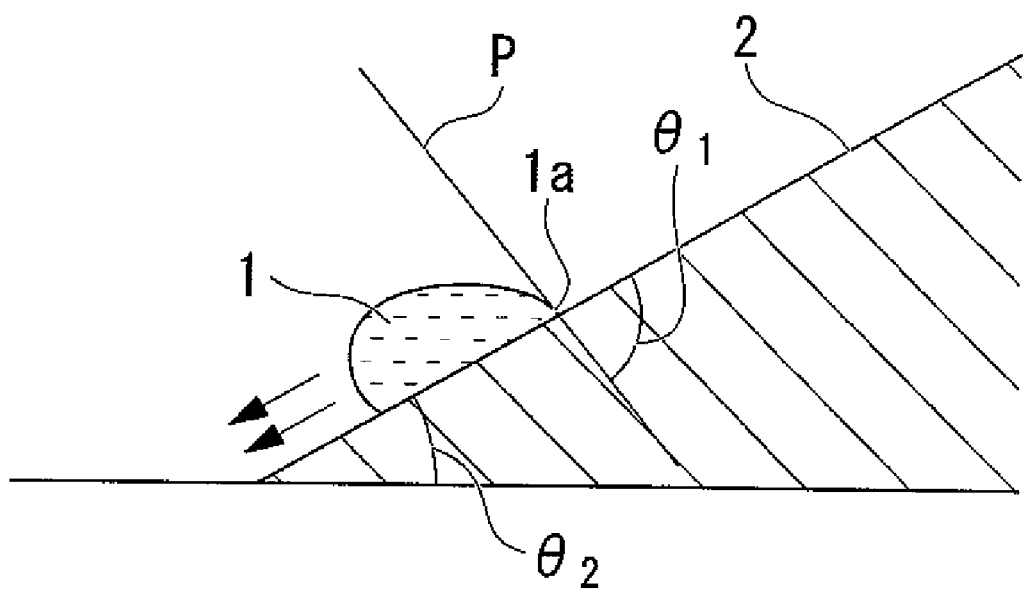
FIG. 1 is an explanatory diagram of receding angle ($\theta_1$) and sliding angle ($\theta_2$).

The positive resist composition for immersion exposure according to the present invention includes a resin component (A) (hereafter referred to as the component (A)) which has acid dissociable, dissolution inhibiting groups and exhibits increased alkali solubility under action of acid, and an acid-generator component (B) (hereafter, frequently referred to as "component (B)") which generates acid upon exposure.

In the positive resist composition for immersion exposure according to the present invention, as the component (A) has acid dissociable, dissolution inhibiting groups, the component (A) is alkali insoluble prior to exposure. When acid is generated from the component (B) upon exposure, the acid dissociable, dissolution inhibiting groups are dissociated. As a result, the alkali solubility of the entire component (A) is increased, and hence, the component (A) changes from alkali insoluble to alkali soluble. Therefore, in the formation of a resist pattern, by conducting selective exposure of a resist film formed by using the positive resist composition for immersion exposure according to the present invention, the exposed portions become alkali soluble, whereas the unexposed portions remain alkali insoluble, and hence, a resist pattern can be formed by alkali developing.

<Component (A)>

In the present invention, the component (A) includes a structural unit (a1) derived from an acrylate ester having an acid dissociable, dissolution inhibiting group and a structural unit (a3) derived from an acrylate ester having a polar group-containing aliphatic hydrocarbon group, and the amount of the structural unit (a3) based on the combined total of all structural units constituting the component (A) is 3 to 12 mol %.

It is preferable that the component (A) further includes a structural unit (a2) derived from an acrylate ester having a lactone-containing cyclic group.

In the present descriptions and claims, the term "structural unit derived from an acrylate ester" refers to a structural unit which is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom, or a group) bonded to the carbon atom on the α-position. As the substituent, a halogen atom, a lower alkyl group or a halogenated lower alkyl group can be mentioned. Examples of the halogen atom include a fluorine atom, a chlorine atom, a bromine atom and an iodine atom, and a fluorine atom is particularly desirable.

With respect to the "structural unit derived from an acrylate ester", the "α-position (the carbon atom on the α-position)" refers to the carbon atom having the carbonyl group bonded thereto, unless specified otherwise.

An "alkyl group" includes a linear, branched or cyclic, monovalent saturated hydrocarbon, unless otherwise specified.

A "lower alkyl group" is an alkyl group of 1 to 5 carbon atoms.

A "halogenated alkyl group" is a lower alkyl group in which a part or all of the hydrogen atoms have been substituted with halogen atoms. As the halogen atoms, the same as the halogen atoms as the substituent bonded to the α-position can be mentioned.

With respect to the acrylate ester, specific examples of the lower alkyl group for the substituent at the α-position include linear or branched alkyl groups such as a methyl group, ethyl group, propyl group, isopropyl group, n-butyl group, isobutyl group, tert-butyl group, pentyl group, isopentyl group, and neopentyl group.

In the present invention, it is preferable that a hydrogen atom, a halogen atom, a lower alkyl group or a halogenated lower alkyl group is bonded to the α-position of the acrylate ester, more preferably a hydrogen atom, a fluorine atom, a lower alkyl group or a fluorinated lower alkyl group. In terms of industrial availability, a hydrogen atom or a methyl group is particularly desirable.

Structural Unit (a1)

In the present invention, the structural unit (a1) is a structural unit derived from an acrylate ester having an acid dissociable, dissolution inhibiting group.

As the acid dissociable, dissolution inhibiting group within the structural unit (a1), any of the groups that have been proposed as acid dissociable, dissolution inhibiting groups for the base resins of chemically amplified resists can be used, provided the group has an alkali dissolution-inhibiting effect that renders the entire component (A) alkali-insoluble prior to exposure, and then following dissociation, causes the entire component (A) to change to an alkali-soluble state. Generally, groups that form either a cyclic or chain-like tertiary alkyl ester with the carboxyl group of (meth)acrylic acid, or acetal-type acid dissociable dissolution inhibiting groups such as alkoxyalkyl groups are the most widely known. The term "(meth)acrylic acid" is a generic term that includes either or both of acrylic acid and methacrylic acid. Further, the term "(meth)acrylate ester" is a generic term that includes either or both of the acrylate ester having a hydrogen atom bonded to the α-position and the methacrylate ester having a methyl group bonded to the α-position.

Here, a "tertiary alkyl ester" describes a structure in which an ester is formed by substituting the hydrogen atom of the carboxyl group with a chain-like or cyclic tertiary alkyl group, and the tertiary carbon atom within the chain-like or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with the carboxyl group are referred to as "tertiary alkyl ester-type acid dissociable, dissolution inhibiting groups".

Examples of suitable tertiary alkyl ester-type acid dissociable, dissolution inhibiting groups include aliphatic branched acid dissociable, dissolution inhibiting groups and acid dissociable, dissolution inhibiting groups that contain an aliphatic cyclic group.

In the present description and claims, the term "aliphatic" is a relative concept used in relation to the term "aromatic", and defines a group or compound that has no aromaticity.

The term "aliphatic branched" refers to a branched structure having no aromaticity. An "aliphatic branched acid dissociable, dissolution inhibiting group" is not limited to a group consisting of carbon and hydrogen (hydrocarbon groups), but is preferably a hydrocarbon group. The "hydrocarbon group" may be either saturated or unsaturated, but is preferably saturated.

As the aliphatic branched acid dissociable, dissolution inhibiting group, a tertiary alkyl group of 4 to 8 carbon atoms is preferable, and specific examples include a tert-butyl group, tert-amyl group and tert-heptyl group.

The term "aliphatic cyclic group" refers to a polycyclic or monocyclic group that has no aromaticity.

The "aliphatic cyclic group" within the structural unit (a1) may or may not have a substituent.

Examples of suitable substituent groups include lower alkyl groups of 1 to 5 carbon atoms, a fluorine atom, fluorinated lower alkyl groups of 1 to 5 carbon atoms, and an oxygen atom (=O).

The basic ring structure of the "aliphatic cyclic group" excluding substituent groups is not limited to groups consisting of carbon and hydrogen (hydrocarbon groups), although a hydrocarbon group is preferable. Furthermore, the "hydrocarbon group" may be either saturated or unsaturated, but is preferably saturated. The aliphatic cyclic group is preferably a polycyclic group. The aliphatic cyclic group preferably has 4 to 20 carbon atoms.

Specific examples of this type of aliphatic cyclic group include groups in which one or more hydrogen atoms have been removed from a polycycloalkane such as a monocycloalkane, bicycloalkane, tricycloalkane or tetracycloalkane which may or may not be substituted with a lower alkyl group, a fluorine atom or a fluoroalkyl group. Specific examples of suitable groups include groups in which one or more hydrogen atoms have been removed from a monocycloalkane such as cyclopentane or cyclohexane, or a polycycloalkane such as adamantane, norbornane, isobornane, tricyclodecane or tetracyclododecane.

Examples of acid dissociable, dissolution inhibiting groups that contain an aliphatic cyclic group include groups that contain a tertiary carbon atom within the ring skeleton of a cycloalkyl group, and specific examples include a 2-methyl-2-adamantyl group or 2-ethyl-2-adamantyl group. Other possible groups include those that contain an aliphatic cyclic group such as an adamantyl group, and a branched alkylene group that contains a tertiary carbon atom and is bonded to the aliphatic cyclic group, such as the group bonded to the oxygen atom of the carbonyloxy group (—C(O)—O—) shown within the structural unit represented by a general formula shown below.

[Chemical Formula 1]

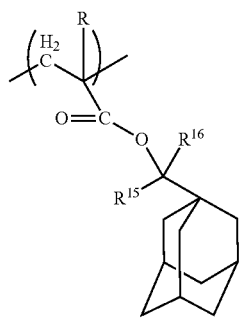

wherein R represents a hydrogen atom, a halogen atom, a lower alkyl group or a halogenated lower alkyl group; and $R^{15}$ and $R^{16}$ represent alkyl groups (which may be either linear or branched groups, and preferably have 1 to 5 carbon atoms).

As the halogen atom, lower alkyl group and halogenated lower alkyl group for R, the same as the halogen atom, lower alkyl group and halogenated lower alkyl group which may be bonded to the α-position of the aforementioned acrylate ester can be exemplified.

An "acetal-type acid dissociable, dissolution inhibiting group" is generally substituted with a hydrogen atom at the terminal of an alkali-soluble group such as a carboxy group or hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 2]

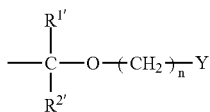

(p1)

wherein $R^{1'}$ and $R^{2'}$ each independently represents a hydrogen atom or a lower alkyl group; n represents an integer of 0 to 3; and Y represents a lower alkyl group or an aliphatic cyclic group.

In general formula (p1) above, n is preferably an integer of 0 to 2, more preferably 0 or 1, and most preferably 0.

As the lower alkyl group for $R^{1'}$ and $R^{2'}$, the same as the lower alkyl groups for R above can be exemplified. As the lower alkyl group for $R^{1'}$ and $R^{2'}$, a methyl group or ethyl group is preferable, and a methyl group is particularly desirable.

In the present invention, it is preferable that at least one of $R^{1'}$ and $R^{2'}$ be a hydrogen atom. That is, it is preferable that the acid dissociable, dissolution inhibiting group (p1) is a group represented by general formula (p1-1) shown below.

[Chemical Formula 3]

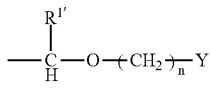

(p1-1)

wherein $R^{1'}$, n and Y are the same as $R^{1'}$, n and Y in general formula (p1) above.

As the lower alkyl group for Y, the same as the lower alkyl groups for R above can be exemplified.

As the aliphatic cyclic group for Y, any of the aliphatic monocyclic/polycyclic groups which have been proposed for conventional ArF resists and the like can be appropriately selected for use. For example, the same groups described above in connection with the "aliphatic cyclic group" can be exemplified.

Further, as the acetal-type, acid dissociable, dissolution inhibiting group, groups represented by general formula (p2) shown below can also be exemplified.

[Chemical Formula 4]

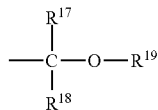

(p2)

wherein $R^{17}$ and $R^{18}$ each independently represents a linear or branched alkyl group or a hydrogen atom; and $R^{19}$ represents a linear, branched or cyclic alkyl group; or the terminal of $R^{17}$ may be bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated lower alkyl group, may be exemplified. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane. Of these, a group in which one or more hydrogen atoms have been removed from adamantane is preferable.

In general formula (p2) above, $R^{17}$ and $R^{19}$ may each independently represent an alkylene group of 1 to 5 carbon atoms, and the terminal of $R^{19}$ may be bonded to the terminal of $R^{17}$.

In such a case, a cyclic group is formed by $R^{17}$, $R^{19}$, the oxygen atom having $R^{19}$ bonded thereto and the carbon atom having the oxygen atom and $R^{17}$ bonded thereto. Such a cyclic group is preferably a 4 to 7-membered ring, and more preferably a 4 to 6-membered ring. Specific examples of the cyclic group include tetrahydropyranyl group and tetrahydrofuranyl group.

Specific examples of the structural unit (a1) include structural units represented by general formulas (a1-1) to (a1-4) shown below.

[Chemical Formula 5]

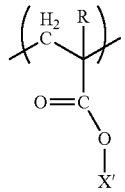

(a1-1)

-continued

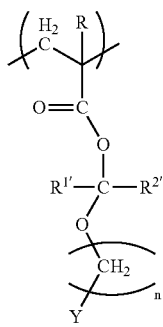
(a1-2)

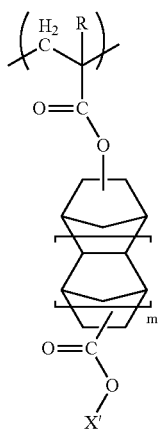
(a1-3)

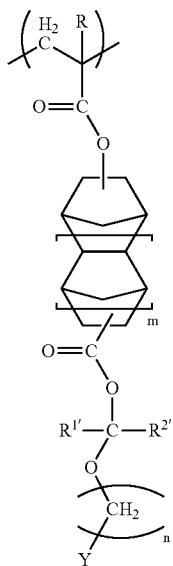
(a1-4)

wherein X' represents a tertiary alkyl ester-type acid dissociable, dissolution inhibiting group; Y represents a lower alkyl group of 1 to 5 carbon atoms or an aliphatic cyclic group; n represents an integer of 0 to 3; m represents 0 or 1; R represents a hydrogen atom, a halogen atom, a lower alkyl group or a halogenated lower alkyl group; and $R^{1\prime}$ and $R^{2\prime}$ each independently represents a hydrogen atom or a lower alkyl group of 1 to 5 carbon atoms.

As the halogen atom, lower alkyl group and halogenated lower alkyl group for R, the same as the halogen atom, lower alkyl group and halogenated lower alkyl group which may be bonded to the α-position of the aforementioned acrylate ester can be exemplified.

It is preferable that at least one of $R^{1\prime}$ and $R^{2\prime}$ represent a hydrogen atom, and it is more preferable that both of $R^{1\prime}$ and $R^{2\prime}$ represent a hydrogen atom. n is preferably 0 or 1.

Examples of the tertiary alkyl ester-type acid dissociable, dissolution inhibiting group for X' are the same as the above-exemplified tertiary alkyl ester-type acid dissociable, dissolution inhibiting groups for $X^1$.

Examples of the aliphatic cyclic group for Y are the same as those exemplified above in connection with the explanation of "aliphatic cyclic group".

Specific examples of structural units represented by general formula (a1-1) to (a1-4) are shown below.

[Chemical Formula 6]

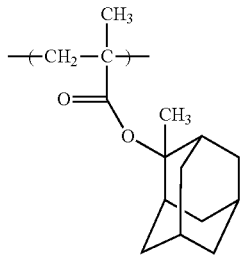
(a1-1-1)

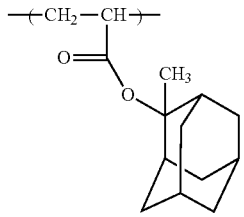
(a1-1-2)

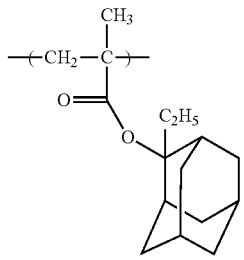
(a1-1-3)

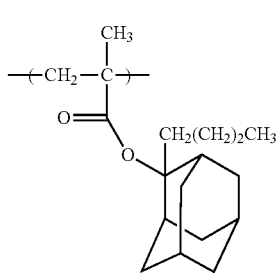
(a1-1-4)

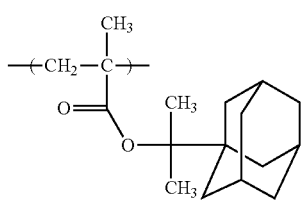
(a1-1-5)

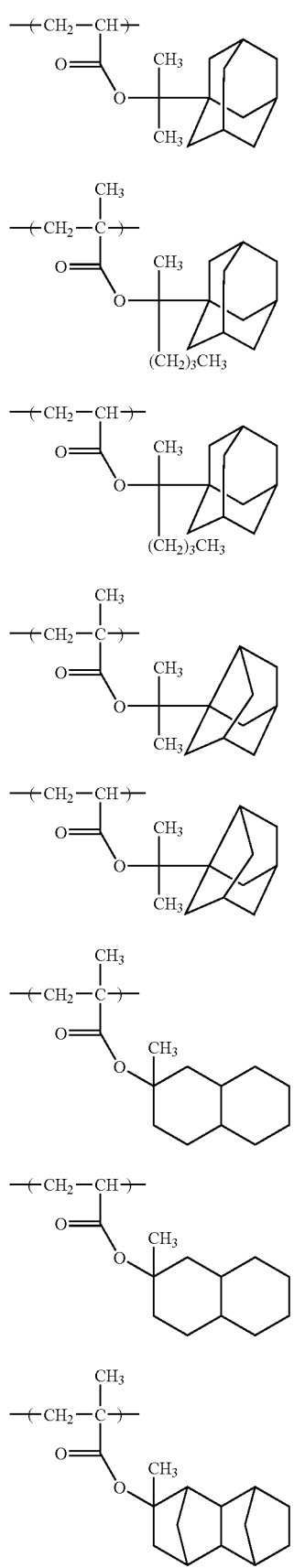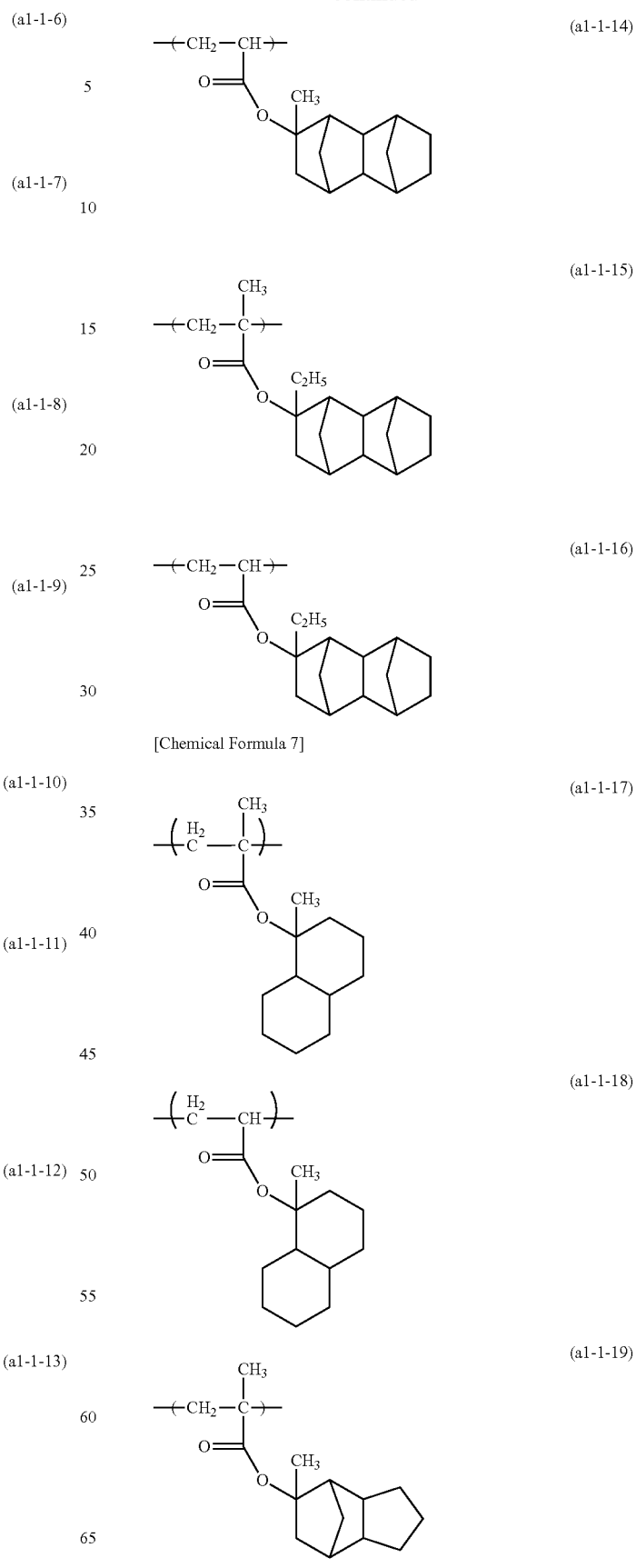

(a1-1-20) 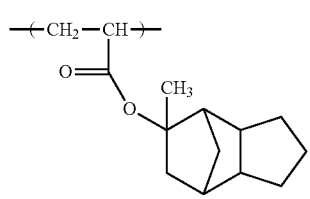
(a1-1-21) 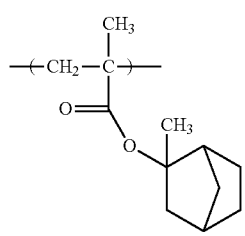
(a1-1-22) 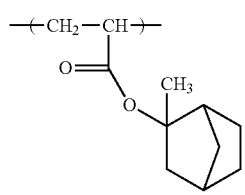
(a1-1-23) 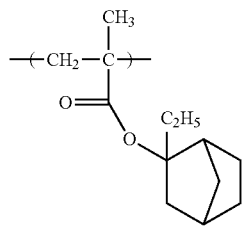
(a1-1-24) 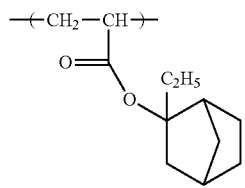
(a1-1-25) 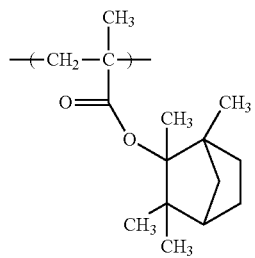
(a1-1-26) 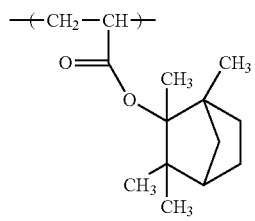
(a1-1-27) 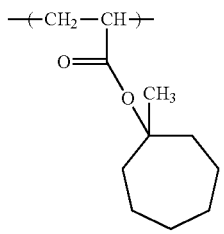
(a1-1-28) 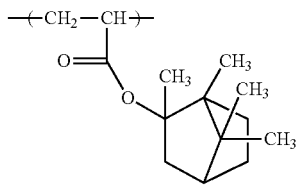
(a1-1-29) 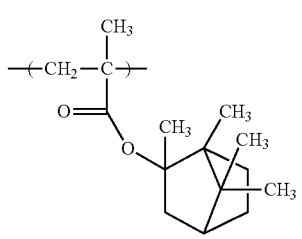
(a1-1-30) 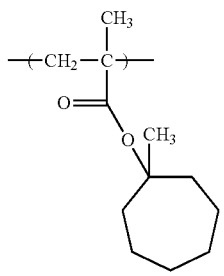
(a1-1-31) 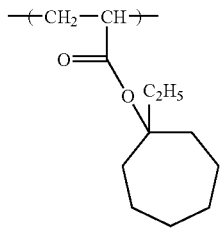
(a1-1-32) 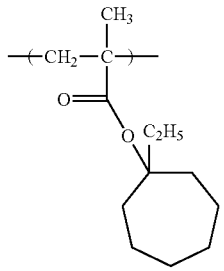

[Chemical Formula 8]
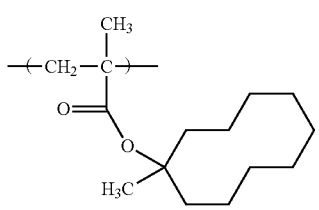 (a1-1-33)
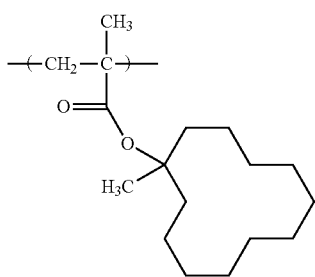 (a1-1-34)
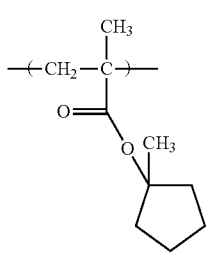 (a1-1-35)
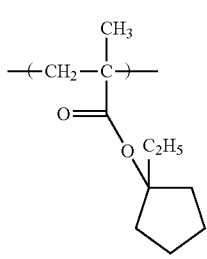 (a1-1-36)
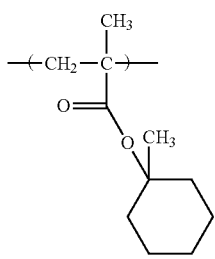 (a1-1-37)
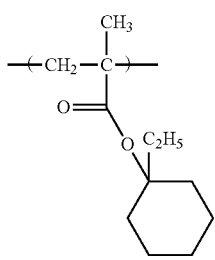 (a1-1-38)
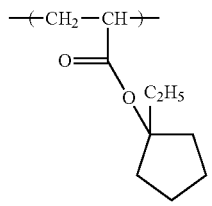 (a1-1-39)
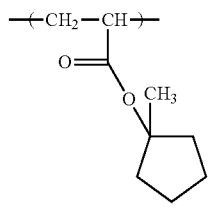 (a1-1-40)
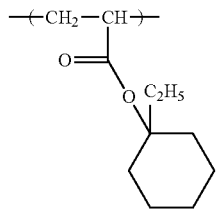 (a1-1-41)
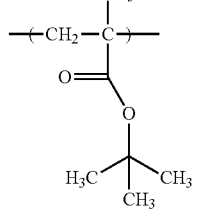 (a1-1-42)
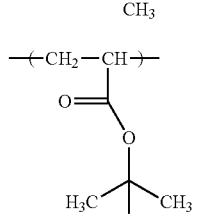 (a1-1-43)
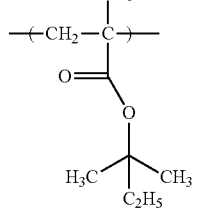 (a1-1-44)
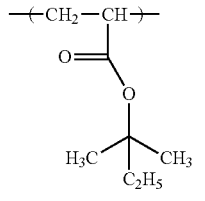 (a1-1-45)

[Chemical Formula 9]
(a1-2-1) 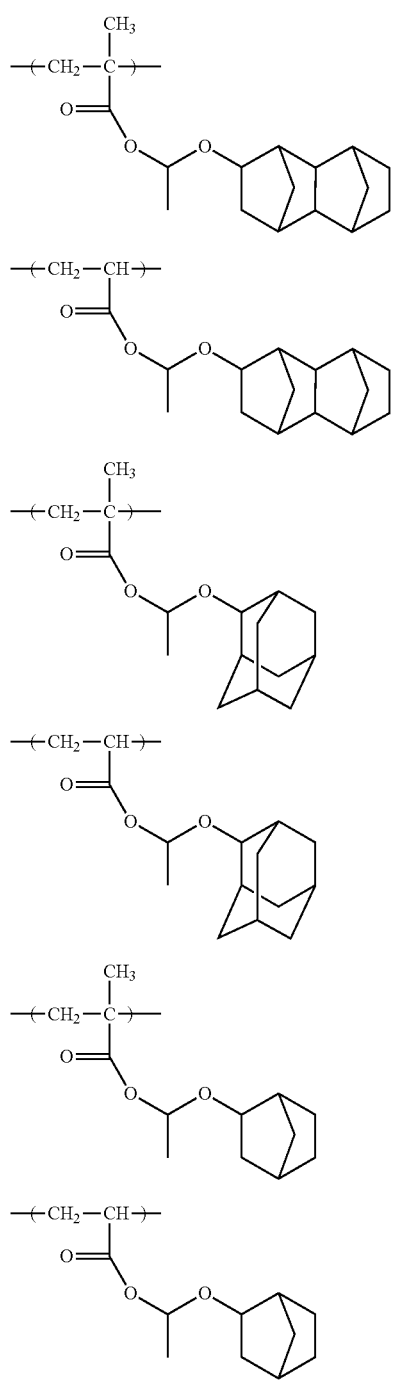
(a1-2-2)
(a1-2-3)
(a1-2-4)
(a1-2-5)
(a1-2-6)
[Chemical Formula 10]
(a1-2-7) 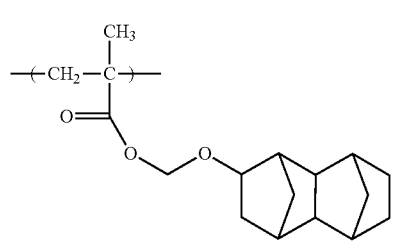
(a1-2-8) 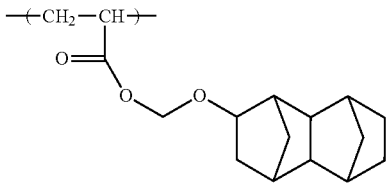
(a1-2-9) 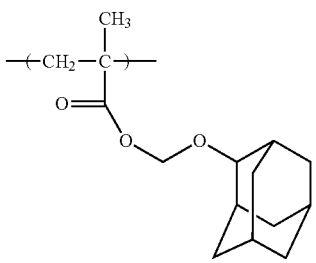
(a1-2-10) 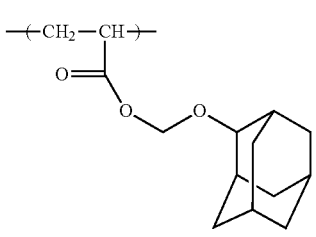
(a1-2-11) 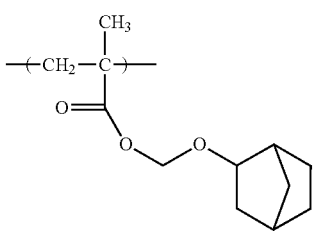
(a1-2-12) 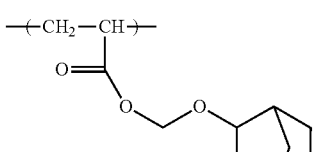
(a1-2-13) 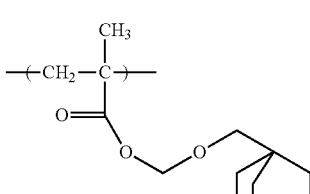
(a1-2-14) 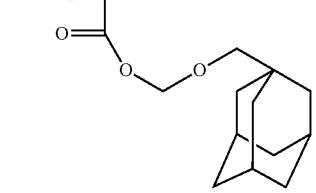

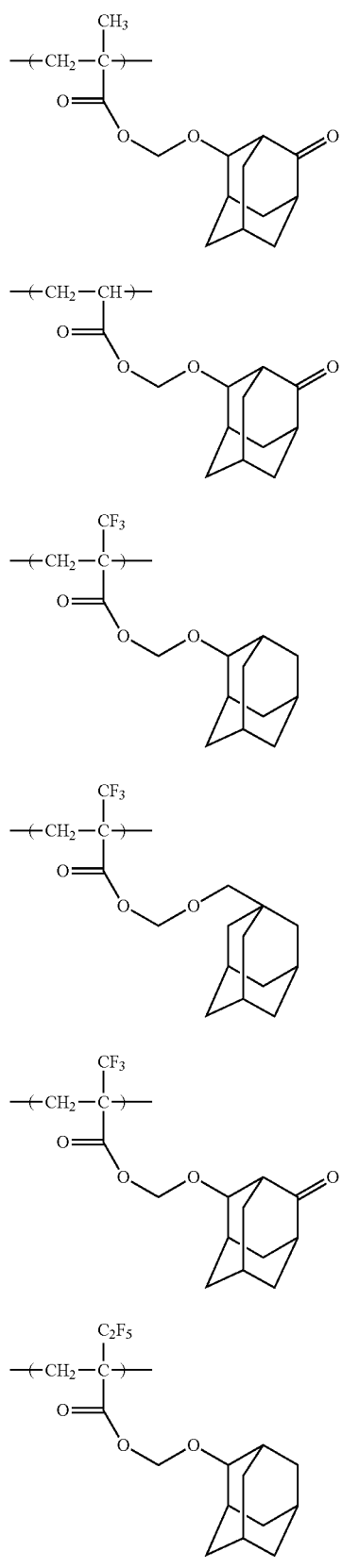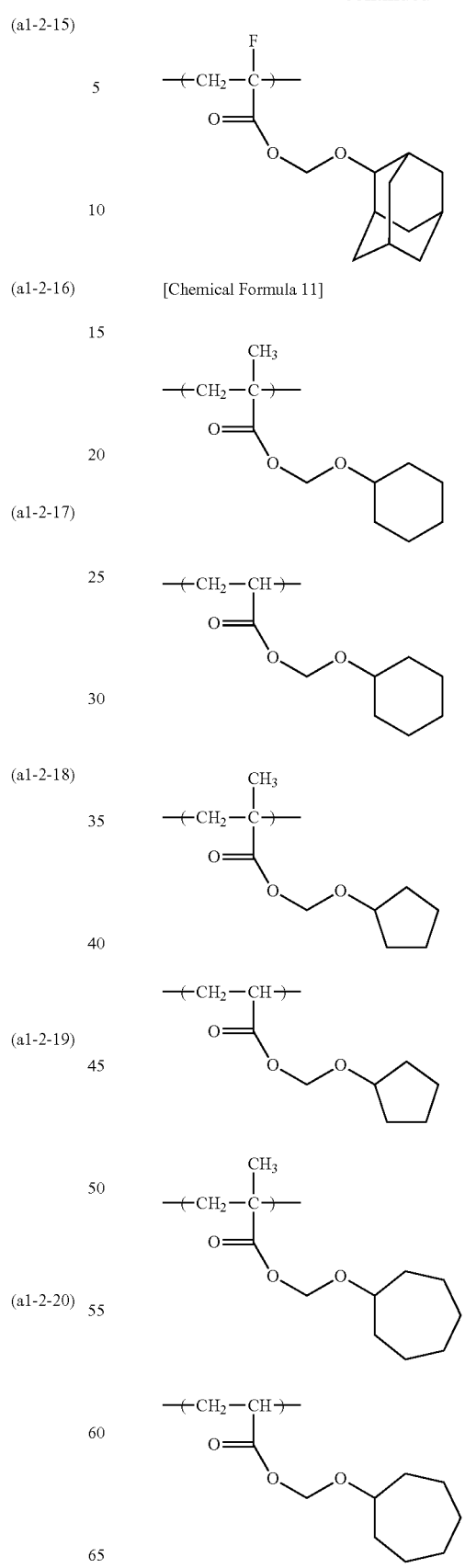

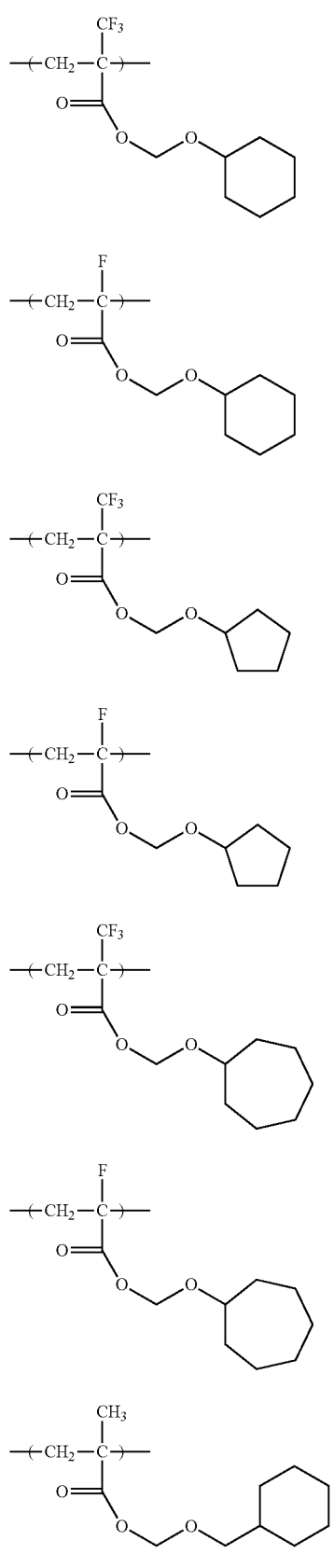
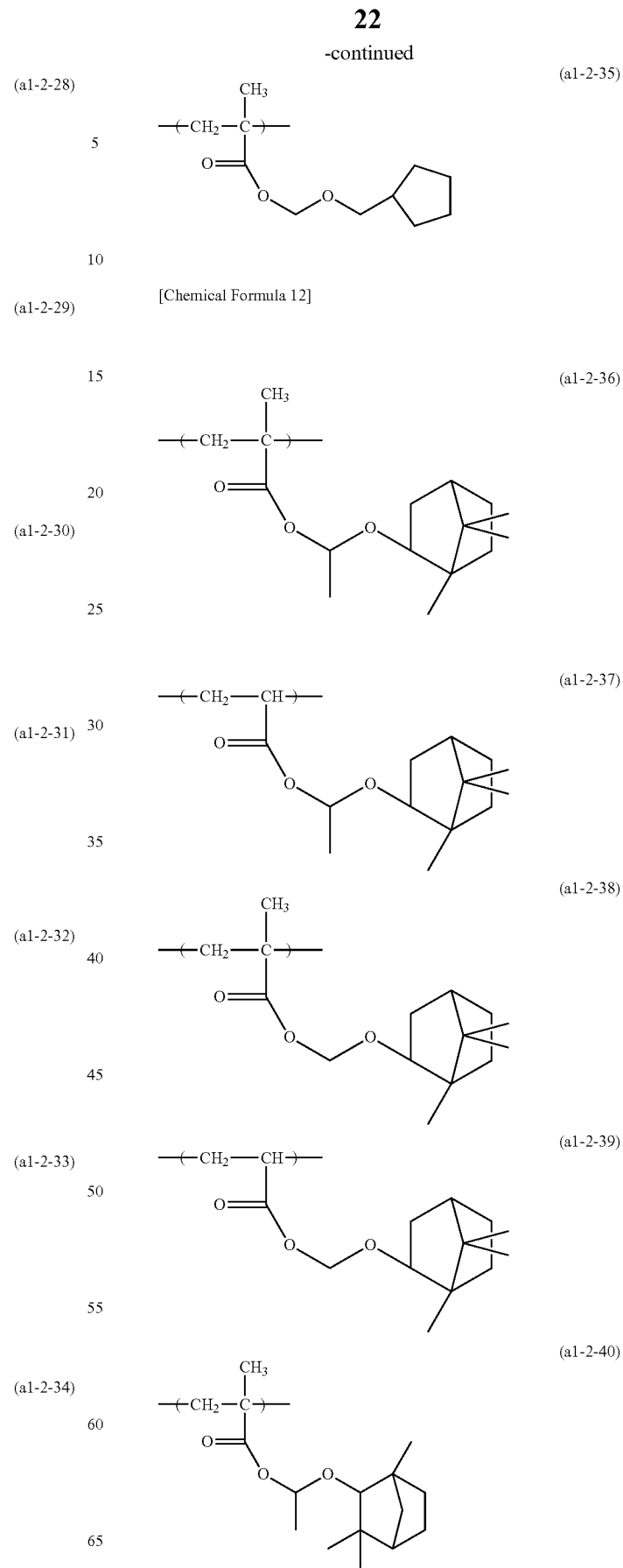

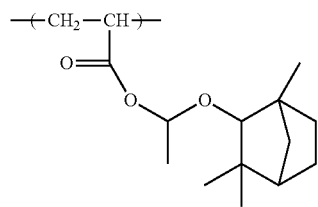
(a1-2-41)
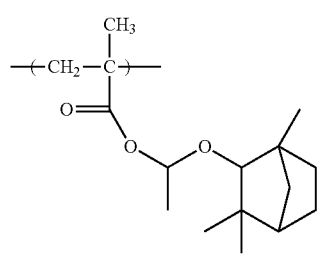
(a1-2-42)
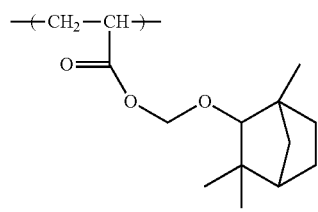
(a1-2-43)
[Chemical Formula 13]
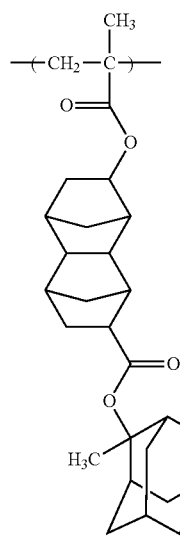
(a1-3-1)
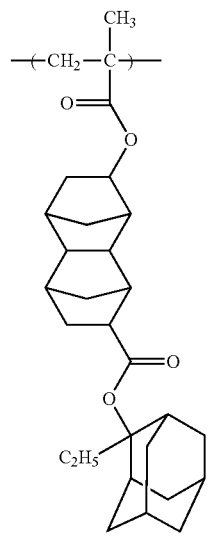
(a1-3-2)
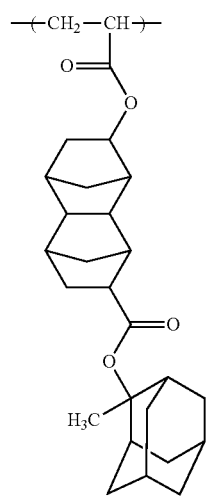
(a1-3-3)
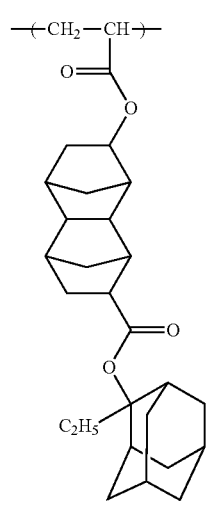
(a1-3-4)

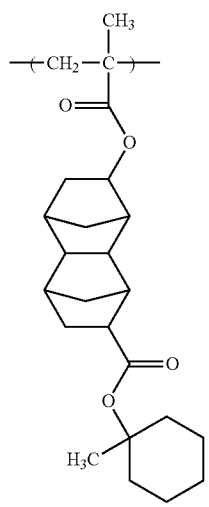
(a1-3-5)
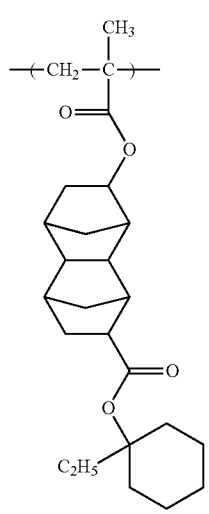
(a1-3-6)
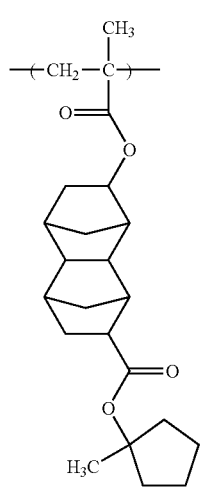
(a1-3-7)
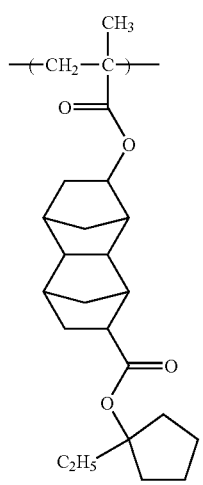
(a1-3-8)
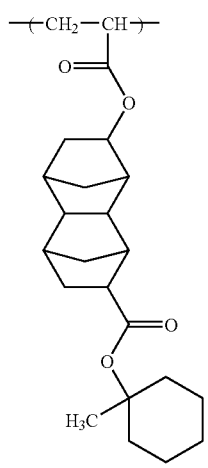
(a1-3-9)
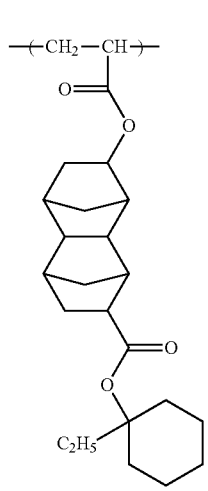
(a1-3-10)

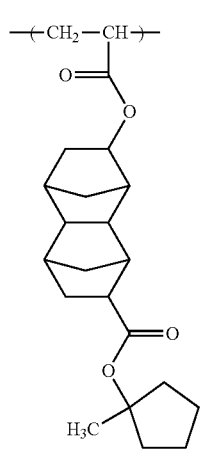 (a1-3-11)
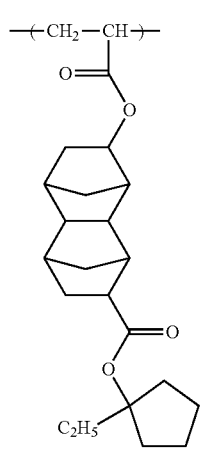 (a1-3-12)
[Chemical Formula 14]
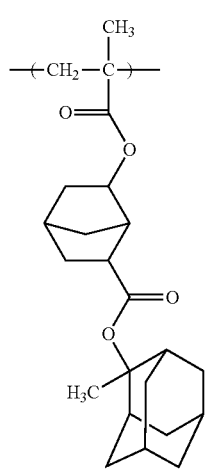 (a1-3-13)
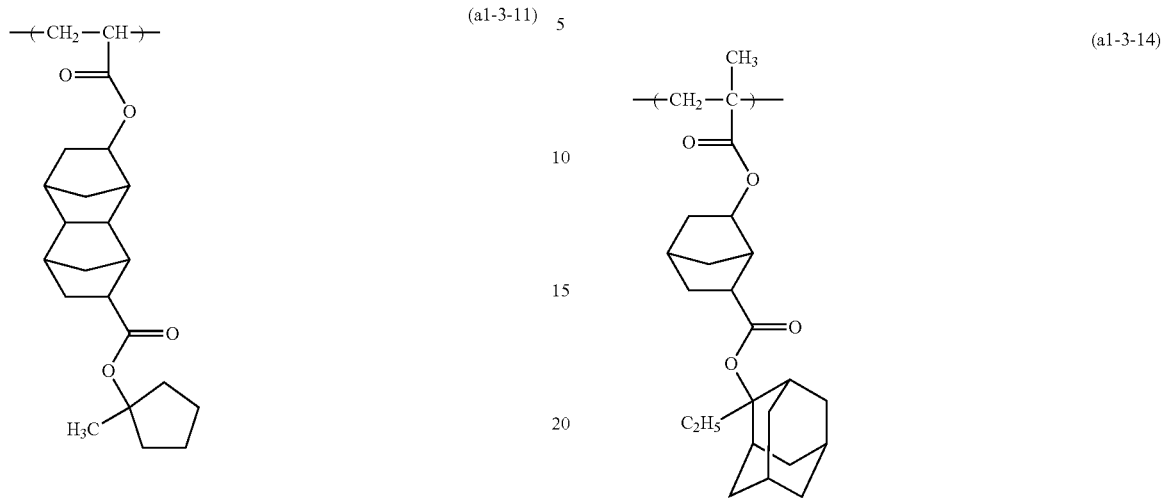

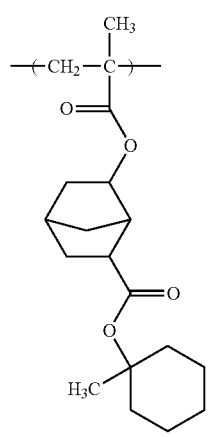 (a1-3-17)
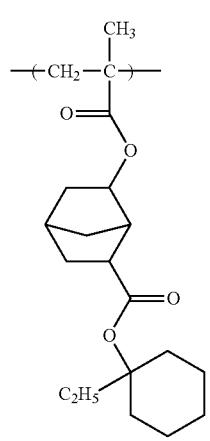 (a1-3-18)
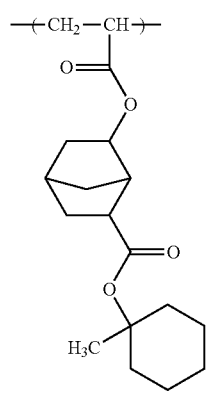 (a1-3-19)
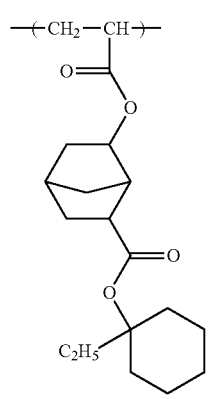 (a1-3-20)
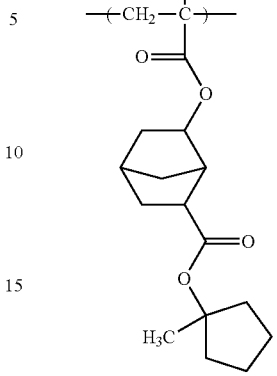 (a1-3-21)
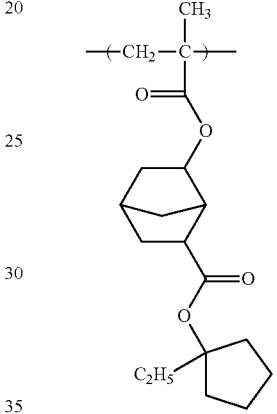 (a1-3-22)
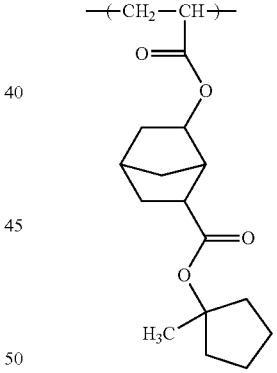 (a1-3-23)
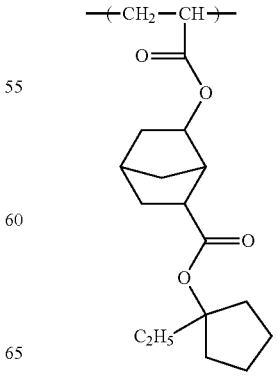 (a1-3-24)

[Chemical Formula 15]
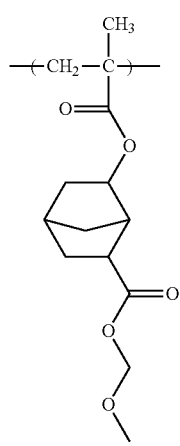 (a1-4-1)
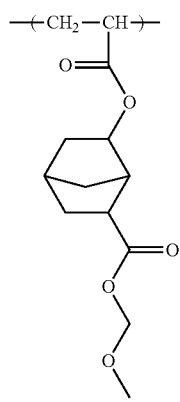 (a1-4-2)
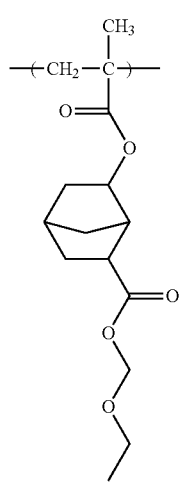 (a1-4-3)
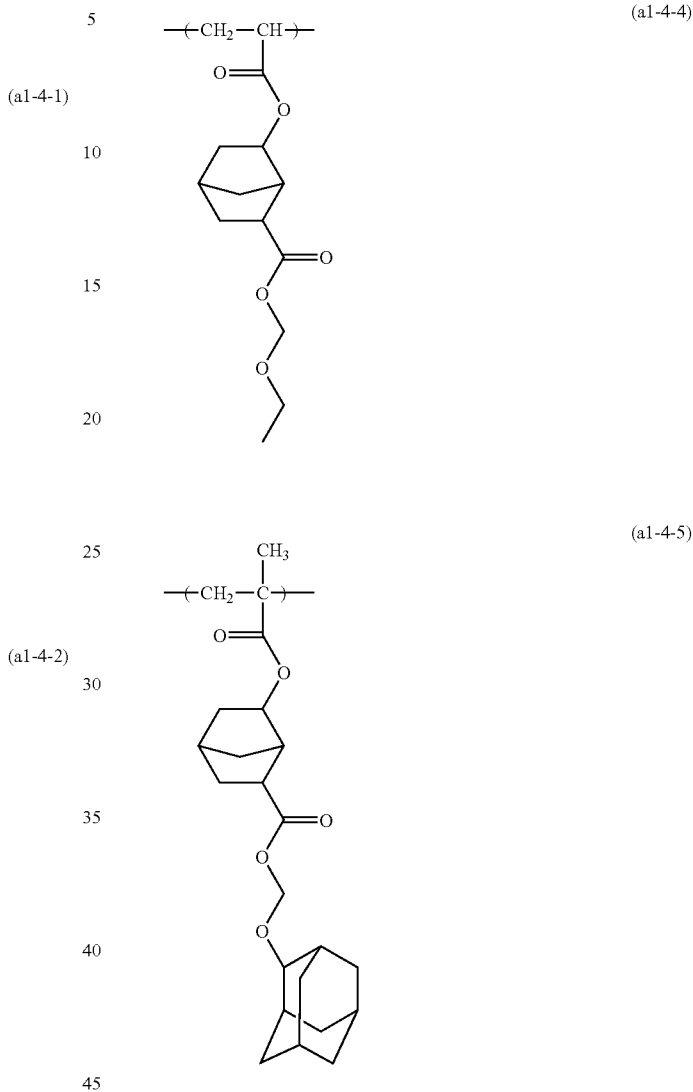
(a1-4-4)
(a1-4-5)
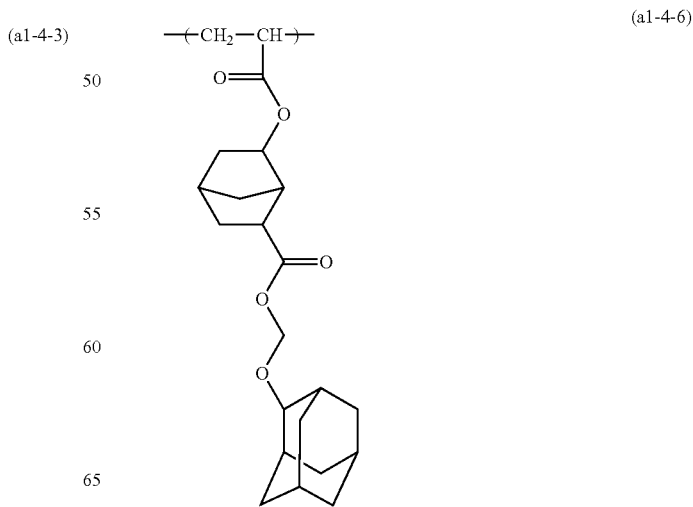 (a1-4-6)

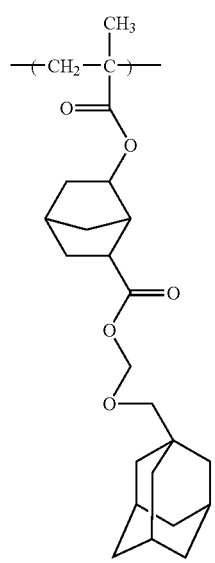
(a1-4-7)
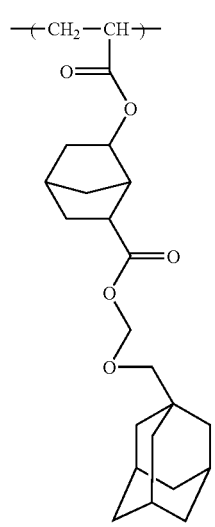
(a1-4-8)
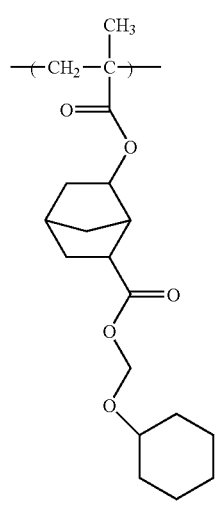
(a1-4-9)
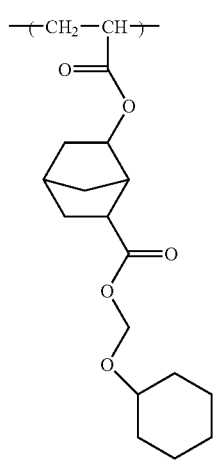
(a1-4-10)
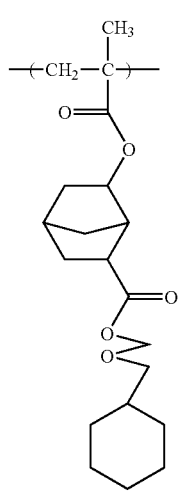
(a1-4-11)
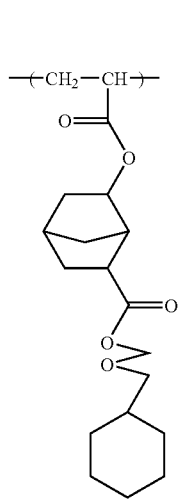
(a1-4-12)

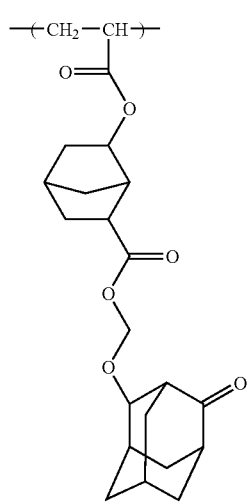
(a1-4-13)
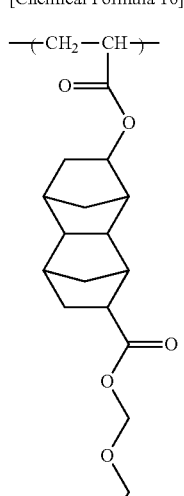
(a1-4-16)
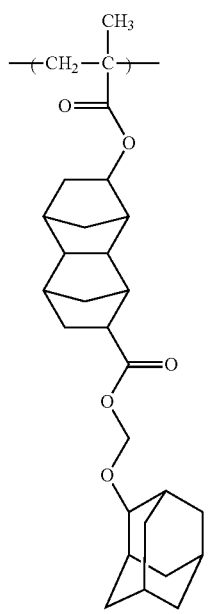
(a1-4-14)
(a1-4-17)
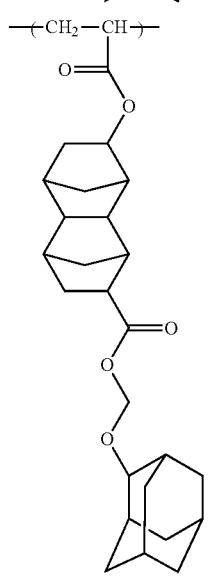
(a1-4-15)
(a1-4-18)

(a1-4-19)
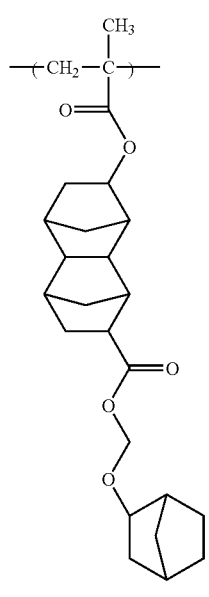
(a1-4-20)
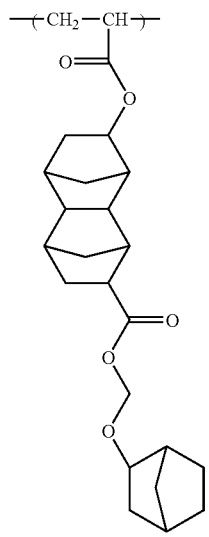
(a1-4-21)
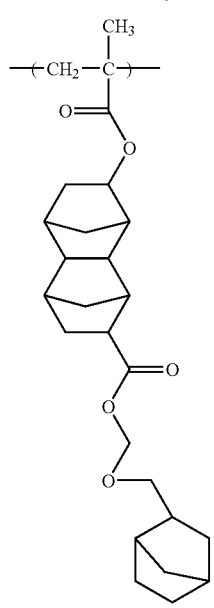
(a1-4-22)
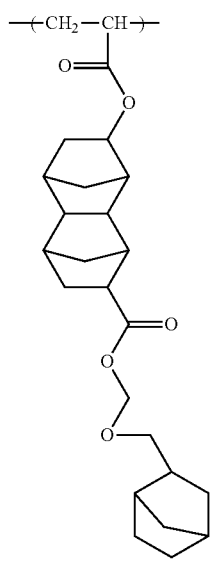
(a1-4-23)
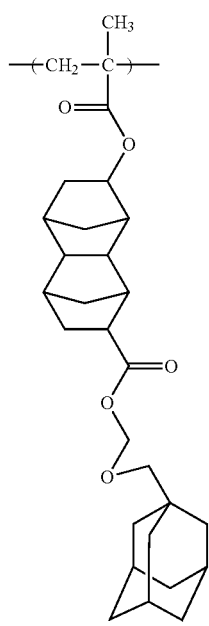

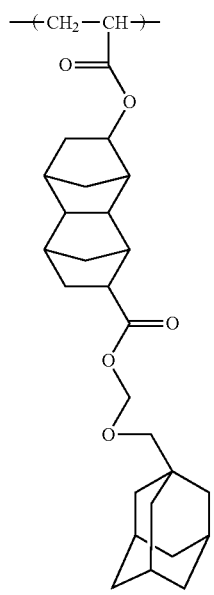
(a1-4-24)
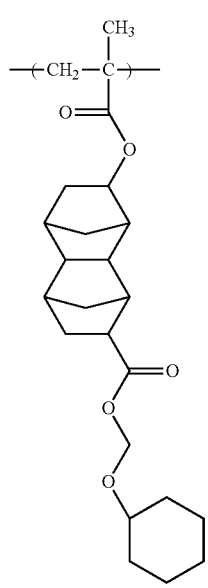
(a1-4-25)
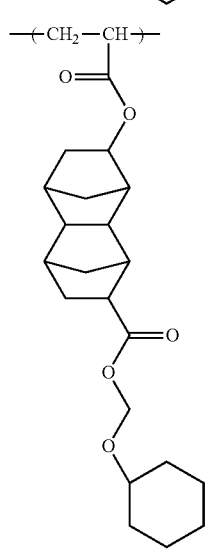
(a1-4-26)
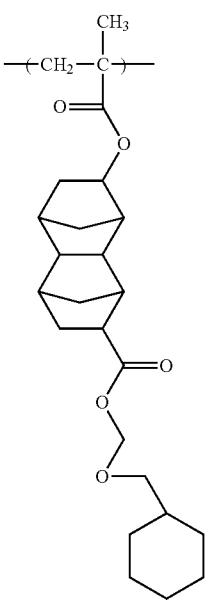
(a1-4-27)
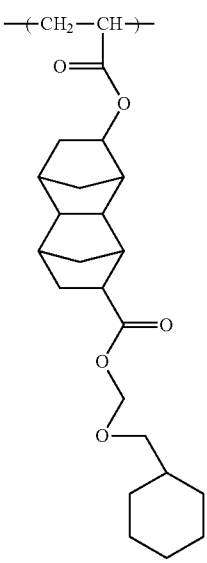
(a1-4-28)

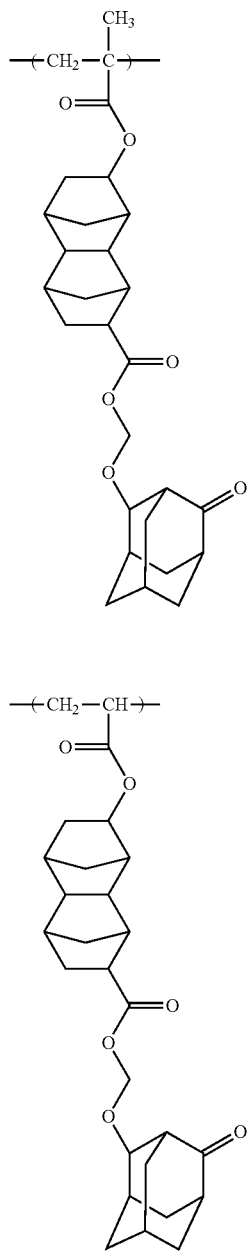

As the structural unit (a1), one type may be used alone, or two or more types may be used in combination.

Among these, structural units represented by general formula (a1-1) are preferable. More specifically, at least one structural unit selected from the group consisting of structural units represented by formulas (a1-1-1) to (a-1-6) and (a1-1-35) to (a1-1-41) is more preferable.

Further, as the structural unit (a1), structural units represented by general formula (a1-1-01) shown below which includes the structural units represented by formulas (a1-1-1) to (a1-1-4), and structural units represented by general formula (a1-1-02) shown below which includes the structural units represented by formulas (a1-1-35) to (a1-1-41) are also preferable.

[Chemical Formula 17]

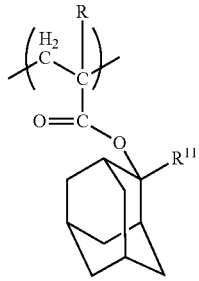

(a1-1-01)

wherein R represents a hydrogen atom, a halogen atom, a lower alkyl group or a halogenated lower alkyl group; and $R^{11}$ represents a lower alkyl group.

[Chemical Formula 17]

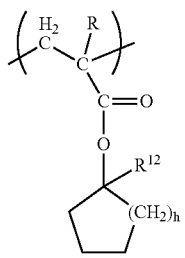

(a1-1-02)

wherein R represents a hydrogen atom, a halogen atom, a lower alkyl group or a halogenated lower alkyl group; $R^{12}$ represents a lower alkyl group; and h represents an integer of 1 to 3.

In general formula (a1-1-01), as the halogen atom, lower alkyl group and halogenated lower alkyl group for R, the same as the halogen atom, lower alkyl group and halogenated lower alkyl group which may be bonded to the α-position of the aforementioned acrylate ester can be exemplified. The lower alkyl group for $R^{11}$ is the same as the lower alkyl group for R above, and is preferably a methyl group or an ethyl group, and most preferably an ethyl group.

In general formula (a1-1-02), as the halogen atom, lower alkyl group and halogenated lower alkyl group for R, the same as the halogen atom, lower alkyl group and halogenated lower alkyl group which may be bonded to the α-position of the aforementioned acrylate ester can be exemplified. The lower alkyl group for $R^{12}$ is the same as the lower alkyl group for R above. $R^{12}$ is preferably a methyl group or an ethyl group, and most preferably an ethyl group. h is preferably 1 or 2, and most preferably 2.

In the component (A), the amount of the structural unit (a1) based on the combined total of all structural units constituting the component (A) is preferably 10 to 80 mol %, more preferably 20 to 70 mol %, and still more preferably 25 to 50 mol %. By making the amount of the structural unit (a1) at least as large as the lower limit of the above-mentioned range, a pattern can be easily formed using a resist composition prepared from the component (A). On the other hand, by making the amount of the structural unit (a1) no more than the upper limit of the above-mentioned range, a good balance can be achieved with the other structural units.

Structural Unit (a3)

In the present invention, the component (A) includes a structural unit (a3) derived from an acrylate ester having a polar group-containing aliphatic hydrocarbon group, and the amount of the structural unit (a3) based on the combined total of all structural units constituting the component (A) is 3 to 12 mol %.

By including the structural unit (a3) in the above-mentioned specific amount, the hydrophilicity of the component (A) is improved, and hence, the affinity of the component (A) for a developing solution is improved. As a result, the alkali solubility of the exposed portions improves, which contributes to favorable improvements in the resolution.

Examples of the polar group include a hydroxyl group, cyano group, carboxyl group, or hydroxyalkyl group in which some of the hydrogen atoms of the alkyl group have been substituted with fluorine atoms (the alkyl group preferably having 1 to 5 carbon atoms), although a hydroxyl group is particularly desirable.

Examples of the aliphatic hydrocarbon group include linear or branched hydrocarbon groups (preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers.

Of the various possibilities, structural units derived from acrylate esters having an aliphatic polycyclic group that contains a hydroxyl group, cyano group, carboxyl group or a hydroxyalkyl group in which some of the hydrogen atoms of the alkyl group have been substituted with fluorine atoms are particularly desirable. Examples of suitable polycyclic groups include groups in which one or more hydrogen atoms have been removed from a bicycloalkane, tricycloalkane or tetracycloalkane or the like. Specific examples include groups in which one or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, groups in which two or more hydrogen atoms have been removed from norbornane, and groups in which two or more hydrogen atoms have been removed from tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyalkyl ester of acrylic acid. On the other hand, when the hydrocarbon group is a polycyclic group, structural units represented by formulas (a3-1), (a3-2) and (a3-3) shown below are preferable.

[Chemical Formula 19]

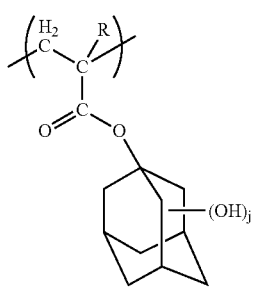

(a3-1)

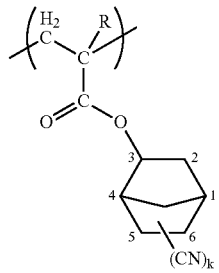

(a3-2)

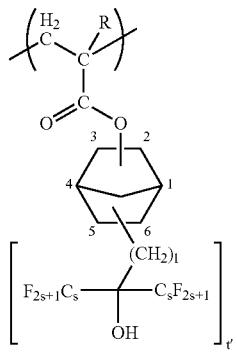

(a3-3)

wherein R a hydrogen atom, a halogen atom, a lower alkyl group or a halogenated lower alkyl group; j is an integer of 1 to 3; k is an integer of 1 to 3; t' is an integer of 1 to 3; l is an integer of 1 to 3; and s is an integer of 1 to 3.

As the halogen atom, lower alkyl group and halogenated lower alkyl group for R, the same as the halogen atom, lower alkyl group and halogenated lower alkyl group which may be bonded to the α-position of the aforementioned acrylate ester can be exemplified.

In formula (a3-1), j is preferably 1 or 2, and more preferably 1. When j is 2, it is preferable that the hydroxyl groups be bonded to the 3rd and 5th positions of the adamantyl group. When j is 1, it is particularly desirable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbonyl group.

In formula (a3-3), t' is preferably 1, l is preferably 1 and s is preferably 1. Further, in formula (a3-3), it is preferable that a 2-norbonyl group or 3-norbonyl group be bonded to the terminal of the carboxy group of the acrylic acid. The fluorinated alkyl alcohol is preferably bonded to the 5th or 6th position of the norbonyl group.

As the structural unit (a3), one type of structural unit may be used, or two or more types may be used in combination.

In the component (A), the amount of structural unit (a3) based on the combined total of all structural units constituting the component (A) is 3 to 12 mol %, preferably 5 to 10 mol %, and most preferably 7 to 10 mol %. By making the amount of the structural unit (a3) at least as large as the lower limit of the above-mentioned range, lithography properties such as resolution are improved. On the other hand, by making the amount of the structural unit (a3) no more than the upper limit of the above-mentioned range, the effect of suppressing elution of a substance during immersion exposure can be achieved, and a good balance can be achieved with the other structural units.

For making the amount of the structural unit (a3) within the component (A) 3 to 12 mol %, as described below, for example, the amount of the monomer charged for deriving the structural unit (a3) in the polymerization for obtaining the component (A) can be adjusted, or the mixing ratio of the resin containing the structural unit (a3) can be adjusted.

Structural Unit (a2)

The component (A) preferably contains a structural unit (a2) derived from an acrylate ester having a lactone-containing cyclic group.

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A) is used for forming a resist film, the lactone-containing cyclic group of the structural unit (a2) is effective in improving the adhesion between the resist film and the substrate, and increasing the hydrophilicity with a developing solution.

As the structural unit (a2), there is no particular limitation, and an arbitrary structural unit may be used.

Specific examples of lactone-containing monocyclic groups include groups in which one hydrogen atom has been removed from γ-butyrolactone. Specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 20]

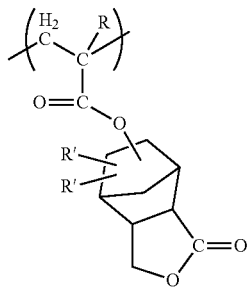
(a2-1)

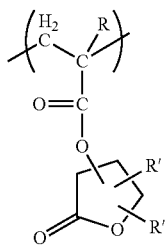
(a2-2)

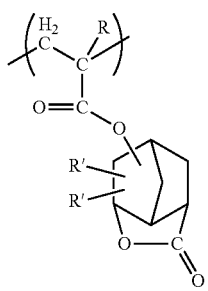
(a2-3)

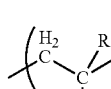
(a2-4)

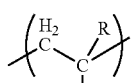
(a2-5)

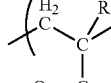

wherein R represents a hydrogen atom, a halogen atom, a lower alkyl group or a halogenated lower alkyl group; R' represents a hydrogen atom, a lower alkyl group or an alkoxy group of 1 to 5 carbon atoms; and m represents 0 or 1.

In general formulas (a2-1) to (a2-5), R is the same as R in the structural unit (a1).

The lower alkyl group for R' is the same as the lower alkyl group for R in the structural unit (a1).

In the structural units represented by general formulas (a2-1) to (a2-5), in consideration of industrial availability, R' is preferably a hydrogen atom.

Specific examples of structural units represented by general formulas (a2-1) to (a2-5) above are shown below.

[Chemical Formula 21]

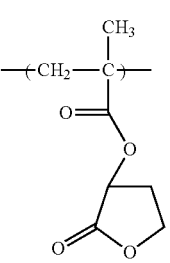
(a2-1-1)

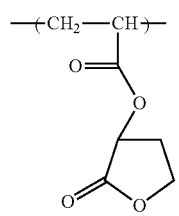 (a2-1-2)
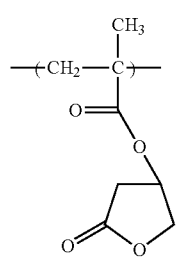 (a2-1-3)
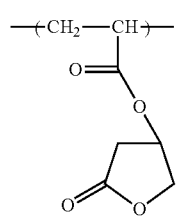 (a2-1-4)
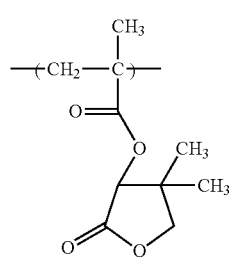 (a2-1-5)
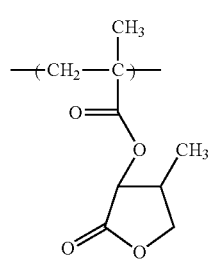 (a2-1-6)
[Chemical Formula 22]
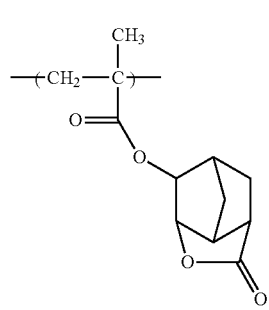 (a2-2-1)
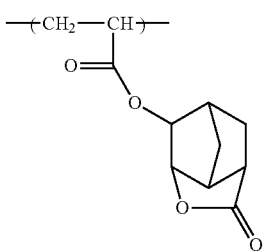 (a2-2-2)
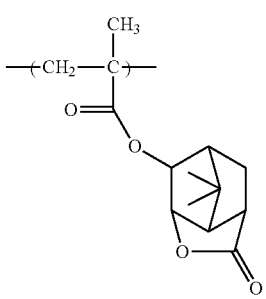 (a2-2-3)
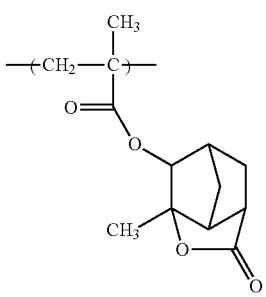 (a2-2-4)
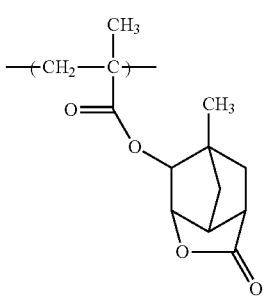 (a2-2-5)
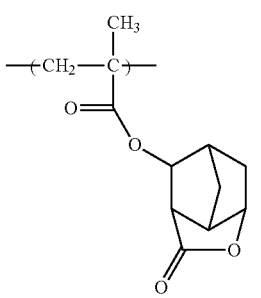 (a2-2-6)

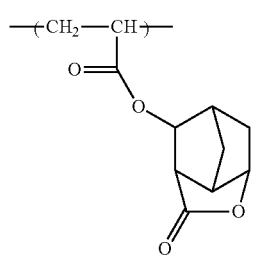 (a2-2-7)
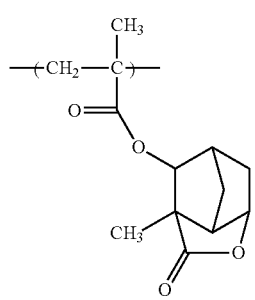 (a2-2-8)
[Chemical Formula 23]
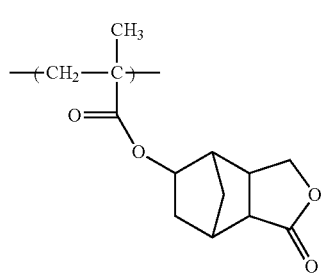 (a2-3-1)
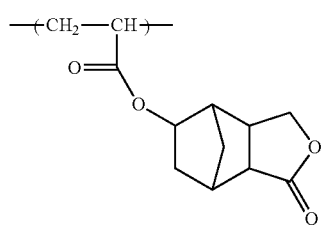 (a2-3-2)
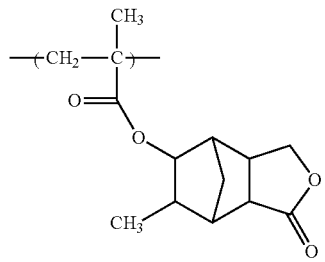 (a2-3-3)
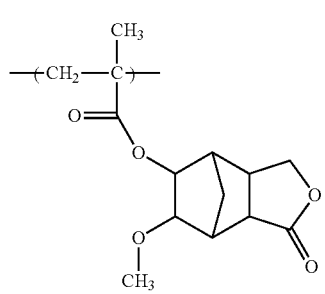 (a2-3-4)
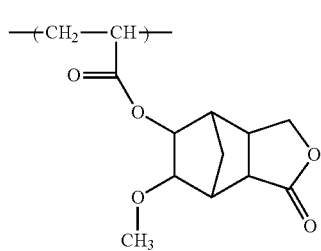 (a2-3-5)
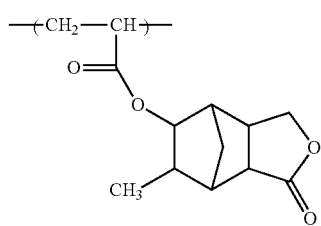 (a2-3-6)
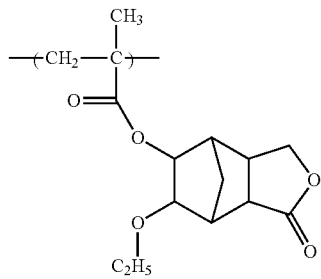 (a2-3-7)
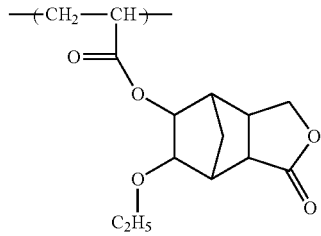 (a2-3-8)
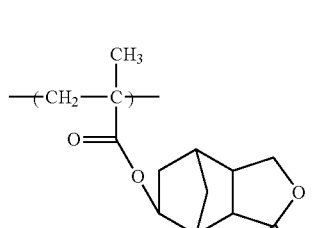 (a2-3-9)
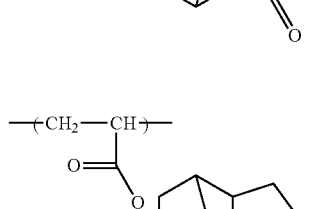 (a2-3-10)

[Chemical Formula 24]
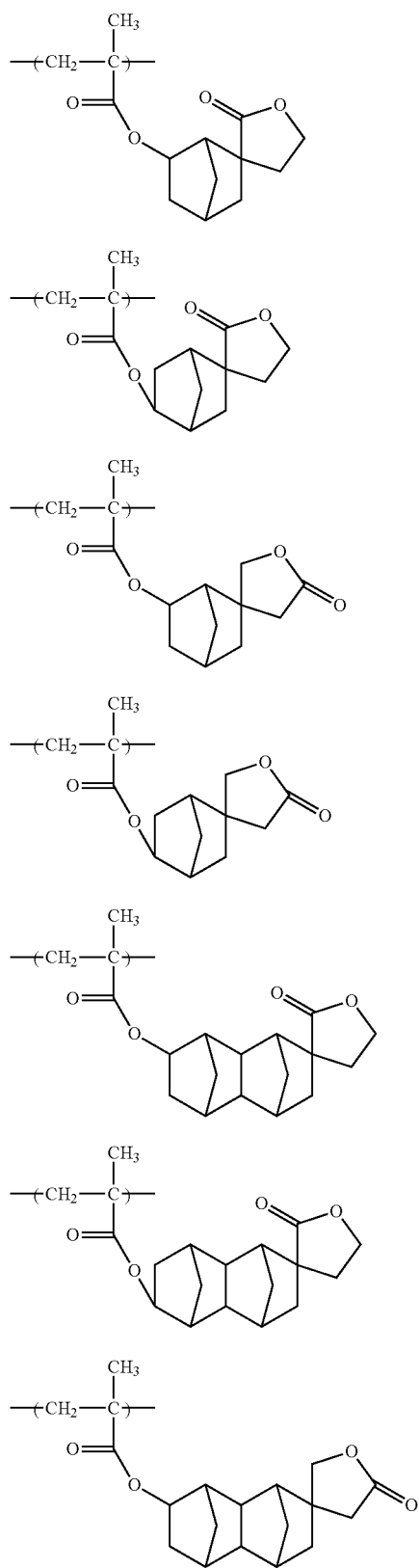
(a2-4-1)
(a2-4-2)
(a2-4-3)
(a2-4-4)
(a2-4-5)
(a2-4-6)
(a2-4-7)
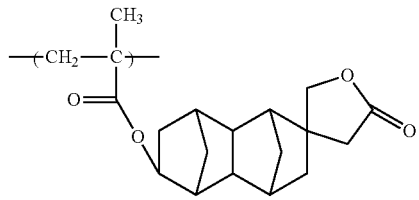
(a2-4-8)
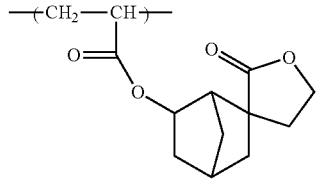
(a2-4-9)
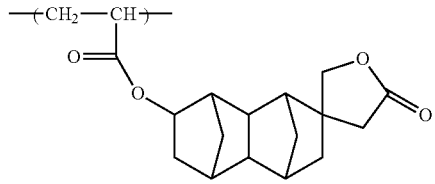
(a2-4-10)
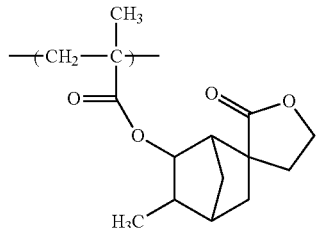
(a2-4-11)
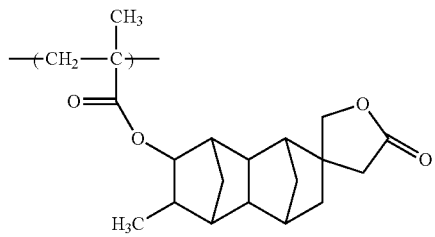
(a2-4-12)
[Chemical Formula 25]
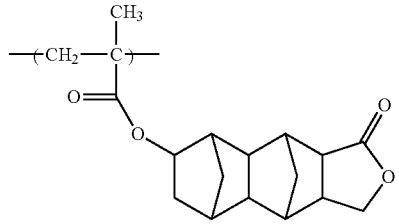
(a2-5-1)
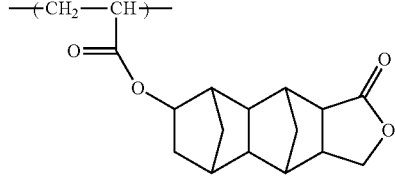
(a2-5-2)

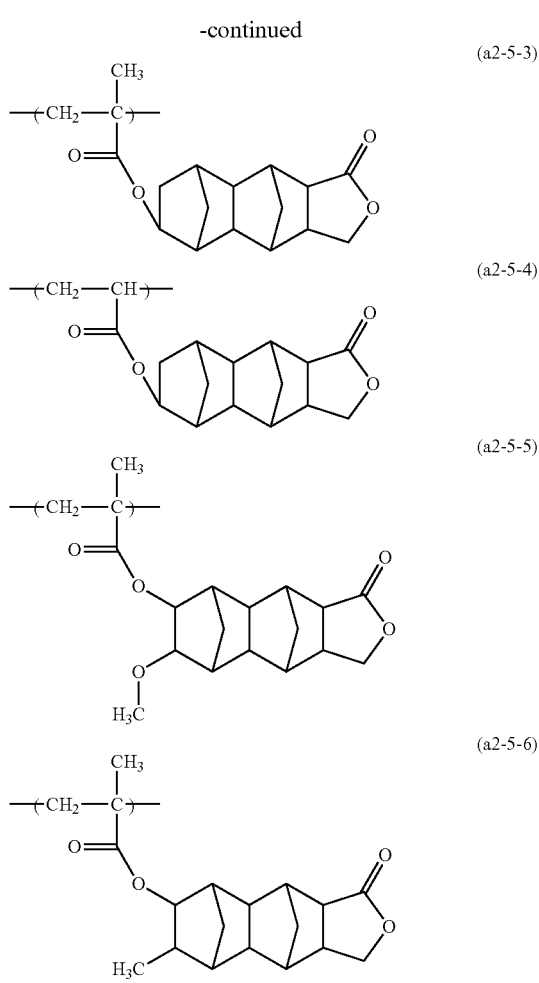

(a2-5-3)

(a2-5-4)

(a2-5-5)

(a2-5-6)

Of these, at least one structural unit selected from the group consisting of formulas (a2-1) to (a2-5) is preferable, and at least one structural unit selected from the group consisting of formulas (a2-1) to (a2-3) is more preferable. Specifically, it is preferable to use at least one structural unit selected from the group consisting of formulas (a2-1-1), (a2-1-2), (a2-2-1), (a2-2-2), (a2-3-1), (a2-3-2), (a2-3-9) and (a2-3-10).

In the component (A), as the structural unit (a2), one type of structural unit may be used, or two or more types may be used in combination. As the structural unit (a2), it is preferable to use two or more types in combination, as the lithography properties are improved. Specifically, it is particularly desirable to use a structural unit (hereafter, referred to as "structural unit (a2-01)") derived from an acrylate ester having a lactone-containing polycyclic group and a structural unit (hereafter, referred to as "structural unit (a2-02)") derived from an acrylate ester having a lactone-containing monocyclic group in combination.

The term "lactone-containing polycyclic group" refers to a cyclic group including one ring containing a —O—C(O)— structure (lactone ring) (as described above for the structural unit (a2)), and one or more other cyclic structures. Examples of the structural unit (a2-01) derived from an acrylate ester having a lactone-containing polycyclic group include structural units represented by general formulas (a2-2) to (a2-5) above, and specific examples include structural units represented by chemical formulas (a2-2-1) to (a2-2-8), (a2-3-1) to (a2-3-10), (a2-4-1) to (a2-4-12) and (a2-5-1) to (a2-5-6).

The term "lactone-containing monocyclic group" refers to a cyclic group consisting of a lactone ring (as described above for the structural unit (a2)). Examples of the structural unit (a2-02) derived from an acrylate ester having a lactone-containing monocyclic group include structural units represented by general formula (a2-1), and specific examples include structural units represented by chemical formulas (a2-1-1) to (a2-1-6).

As the structural unit (a2), when the structural unit (a2-01) and the structural unit (a2-02) are used in combination, the molar ratio of the structural unit (a2-01) to the structural unit (a2-02) is preferably 9:1 to 1:9, more preferably 8:2 to 2:8, and most preferably 6:4 to 4:6.

In the component (A), the amount of the structural unit (a2) based on the combined total of all structural units constituting the component (A) is preferably 5 to 60 mol %, more preferably 10 to 50 mol %, and still more preferably 20 to 50 mol %. By making the amount of the structural unit (a2) at least as large as the lower limit of the above-mentioned range, the effect of using the structural unit (a2) can be satisfactorily achieved. On the other hand, by making the amount of the structural unit (a2) no more than the upper limit of the above-mentioned range, a good balance can be achieved with the other structural units.

Structural Unit (a4)

In the present invention, the component (A) may also include a structural unit (a4) which is other than the above-mentioned structural units (a1) to (a3), as long as the effects of the present invention are not impaired.

As the structural unit (a4), any other structural unit which cannot be classified as one of the above structural units (a1) to (a3) can be used without any particular limitations, and any of the multitude of conventional structural units used within resist resins for ArF excimer lasers or KrF excimer lasers (and particularly for ArF excimer lasers) can be used.

As the structural unit (a4), a structural unit which contains a non-acid-dissociable aliphatic polycyclic group, and is also derived from an acrylate ester is preferable. Examples of this polycyclic group include the same groups as those described above in connection with the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, adamantyl group, tetracyclododecanyl group, isobornyl group, and norbornyl group is particularly desirable. These polycyclic groups may be substituted with a linear or branched alkyl group of 1 to carbon atoms.

Specific examples of the structural unit (a4) include units with structures represented by general formulas (a4-1) to (a4-5) shown below.

[Chemical Formula 26]

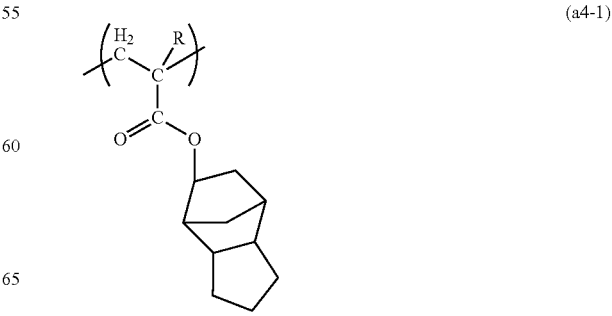

(a4-1)

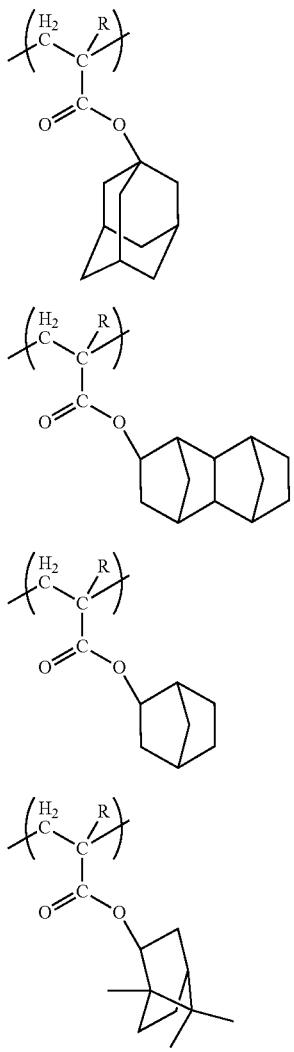

wherein R represents a hydrogen atom, a halogen atom, a lower alkyl group or a halogenated lower alkyl group.

As the halogen atom, lower alkyl group and halogenated lower alkyl group for R, the same as the halogen atom, lower alkyl group and halogenated lower alkyl group which may be bonded to the α-position of the aforementioned acrylate ester can be exemplified.

When the component (A) includes the structural unit (a4), the amount of the structural unit (a4) based on the combined total of all the structural units that constitute the component (A1) is preferably within the range from 1 to 30 mol %, and more preferably from 10 to 20 mol %.

In the present invention, the component (A) includes the structural unit (a1) and the structural unit (a3) (and preferably the structural unit (a2)), and the amount of the structural unit (a3) based on the combined total of all structural units constituting the component (A) is 3 to 12 mol %.

As the component (A), one type of resin may be used alone, or two or more types may be used in combination.

When one type of resin is used alone as the component (A), for example, a copolymer of one type may be used.

As an example of such a copolymer, a copolymer including the structural unit (a1) and the structural unit (a3) may be exemplified.

When two or more types of resins are used in combination as the component (A), for example, a mixture of two types of polymers may be used. An example of such a mixture is a mixture of a copolymer including the structural unit (a1) and the structural unit (a3) and a polymer including the structural unit (a1).

In terms of the effect of suppressing elution of a substance during immersion exposure and improvement in lithography properties of the obtained resist pattern such as mask error factor (MEF) and resolution, it is particularly desirable to use a mixture of a resin (A1) including the structural unit (a1)) the structural unit (a2) and the structural unit (a3), and a resin (A2) including the structural unit (a1) and the structural unit (a2) and excluding the structural unit (a3).

The resin (A1) and the resin (A2) will be described below.

Here, MEF is a parameter that indicates how faithfully mask patterns of differing dimensions can be reproduced (mask reproducibility) by using the same exposure dose with fixed pitch and changing the mask size (e.g., hole diameter of a hole pattern).

[Resin (A1)]

In the present invention, the resin (A1) includes the structural unit (a1), the structural unit (a2) and the structural unit (a3). The resin (A1) may also include a structural unit (a4) which is other than the above-mentioned structural units (a1) to (a3), as long as the effects of the present invention are not impaired.

In the resin (A1), in terms of enhancing the effects of the present invention, the amounts (molar ratio) of the structural units, based on the combined total of all structural units constituting the resin (A1), are as follows. The amount of the structural unit (a1) is preferably 10 to 80 mol %, more preferably 20 to 70 mol %, and still more preferably 25 to 50 mol %.

The amount of the structural unit (a2) is preferably 5 to 60 mol %, more preferably 10 to 50 mol %, and still more preferably 20 to 50 mol %.

The amount of the structural unit is preferably 5 to 50 mol %, more preferably 5 to 40 mol %, and still more preferably 5 to 25 mol %.

When the resin (A1) includes the structural unit (a4), the amount of the structural unit (a4) is preferably 1 to 30 mol %, and more preferably 10 to 20 mol %.

In the present invention, as a preferable resin (A1), a copolymer including the structural units (a1), (a2) and (a3) may be exemplified, and examples of such a copolymer include a copolymer consisting of the structural units (a1), (a2) and (a3), and a copolymer consisting of the structural units (a1), (a2), (a3) and (a4).

As such a copolymer, a copolymer which includes a combination of the structural units shown below is particularly desirable.

[Chemical Formula 27]

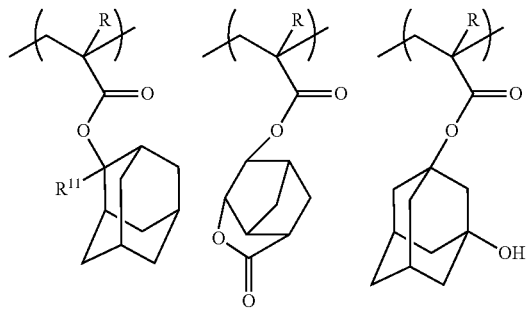

wherein R represents a hydrogen atom, a halogen atom, a lower alkyl group or a halogenated lower alkyl group; and $R^{11}$ represents a lower alkyl group.

In general formula (A1-11), as the halogen atom, lower alkyl group and halogenated lower alkyl group for R, the same as the halogen atom, lower alkyl group and halogenated lower alkyl group which may be bonded to the α-position of the aforementioned acrylate ester can be exemplified. As the lower alkyl group for $R^{11}$, the same as the lower alkyl groups for R above can be exemplified. As the lower alkyl group for $R^{11}$, a methyl group or ethyl group is preferable, and an ethyl group is particularly desirable.

The weight average molecular weight (Mw) (the polystyrene equivalent value determined by gel permeation chromatography) of the resin (A1) is not particularly limited, but is preferably 2,000 to 50,000, more preferably 3,000 to 30,000, and most preferably 5,000 to 20,000. By making the weight average molecular weight no more than the upper limit of the above-mentioned range, the resin (A1) exhibits satisfactory solubility in a resist solvent when used as a resist. On the other hand, by making the weight average molecular weight at least as large as the lower limit of the above-mentioned range, dry etching resistance and cross-sectional shape of the resist pattern becomes satisfactory.

Further, the dispersity (Mw/Mn) is preferably 1.0 to 5.0, more preferably 1.0 to 3.0, and most preferably 1.2 to 2.5. Here, Mn is the number average molecular weight.

In the component (A), as the resin (A1), one type of resin may be used alone, or two or more types may be used in combination.

In the component (A), the amount of the resin (A1) is preferably 10 to 80% by weight, more preferably 15 to 60% by weight, and most preferably 33 to 55% by weight.

When the amount of the resin (A1) is at least as large as the lower limit of the above-mentioned range, satisfactory lithography properties can be obtained. On the other hand, when the amount of the resin (A1) is no more than the upper limit of the above-mentioned range, a good balance can be achieved with the other resin (A2), which results in an improvement of the effect of suppressing elution of a substance.

[Resin (A2)]

In the present invention, the resin (A2) includes the structural unit (a1) and the structural unit (a2) but is exclusive of the structural unit (a3). The resin (A2) may also include a structural unit which is other than the above-mentioned structural units (a1) to (a3), as long as the effects of the present invention are not impaired.

In the resin (A2), in terms of enhancing the effects of the present invention, the amounts (molar ratio) of the structural units, based on the combined total of all structural units constituting the resin (A2), are as follows. The amount of the structural unit (a1) is preferably 10 to 80 mol %, more preferably 20 to 70 mol %, and still more preferably 25 to 50 mol %.

The amount of the structural unit (a2) is preferably 10 to 60 mol %, more preferably 15 to 60 mol %, and still more preferably 20 to 60 mol %.

When the resin (A2) includes the structural unit (a4), the amount of the structural unit (a4) is preferably 1 to 30 mol %, and more preferably 10 to 20 mol %.

In the present invention, a resin (A2-1) including the structural unit (a1), the structural unit (a2-01) derived from an acrylate ester having a lactone-containing polycyclic group and the structural unit (a2-02) derived from an acrylate ester having a lactone-containing monocyclic group, and a resin (A2-2) including the structural unit (a1) and the structural unit (a2-01) can be exemplified as preferable examples, as the lithography properties such as mask error factor (MEF) and resolution are particularly improved. Among these, it is particularly desirable that the resin (A2) include both of the resin (A2-1) and the resin (A2-2) (i.e., the resin (A2) is a combination of the (A2-1) and the resin (A2-2)).

The resin (A2-1) and the resin (A2-2) will be described below.

(Resin (A2-1))

The resin (A2-1) includes the structural unit (a1), the structural unit (a2-01) and the structural unit (a2-02).

In the resin (A2-1), the amounts (molar ratio) of the structural units based on the combined total of all structural units constituting the resin (A2-1) are as follows. The amount of the structural unit (a1) is preferably 10 to 80 mol %, more preferably 20 to 70 mol %, and still more preferably 25 to 50 mol %.

The amount of the structural unit (a2-01) is preferably 5 to 40 mol %, more preferably 10 to 40 mol %, and still more preferably 15 to 30 mol %.

The amount of the structural unit (a2-02) is preferably 5 to 40 mol %, more preferably 10 to 40 mol %, and still more preferably 15 to 30 mol %.

When the resin (A2-1) includes the structural unit (a4), the amount of the structural unit (a4) is preferably 1 to 30 mol %, and more preferably 10 to 20 mol %.

In the present invention, as a preferable resin (A2-1), a copolymer including the structural units (a1), (a2-01) and (a2-02) may be exemplified, and examples of such a copolymer include a copolymer consisting of the structural units (a1), (a2-01) and (a2-02), and a copolymer consisting of the structural units (a1), (a2-01), (a2-02) and (a4).

As such a copolymer, a copolymer which includes a combination of the structural units shown below is particularly desirable.

[Chemical Formula 28]

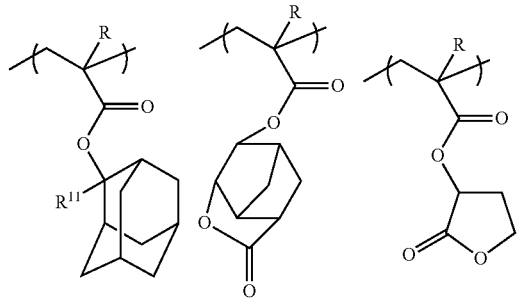

(A2-1-11)

wherein R and $R^{11}$ are as defined in formula (A1-11) above.

In formula (A2-1-11), R is as defined in formula (A1-11) above, and the lower alkyl group for $R^{11}$ is the same as the lower alkyl group for R. $R^{11}$ is preferably a methyl group or ethyl group, and an ethyl group is particularly desirable.

(Resin (A2-2))

The resin (A2-2) includes the structural unit (a1) and the structural unit (a2-01).

In the resin (A2-2), the amounts (molar ratio) of the structural units based on the combined total of all structural units constituting the resin (A2-2) are as follows. The amount of the structural unit (a1) is preferably 10 to 80 mol %, more preferably 20 to 70 mol %, and still more preferably 25 to 50 mol %.

The amount of the structural unit (a2-01) is preferably 10 to 80 mol %, more preferably 20 to 70 mol %, and still more preferably 25 to 50 mol %.

When the resin (A2-2) includes the structural unit (a4), the amount of the structural unit (a4) is preferably 1 to 30 mol %, and more preferably 10 to 20 mol %.

In the present invention, as a preferable resin (A2-2), a copolymer including the structural units (a1) and (a2-01) may be exemplified, and examples of such a copolymer include a copolymer consisting of the structural units (a1) and (a2-01), and a copolymer consisting of the structural units (a1), (a2-01) and (a4).

As such a copolymer, a copolymer which includes a combination of the structural units shown below is particularly desirable.

[Chemical Formula 29]

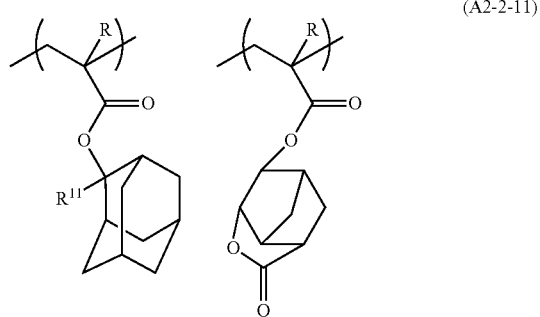

(A2-2-11)

wherein R and $R^{11}$ are as defined in formula (A1-11) above.

In formula (A2-2-11), R is as defined in formula (A1-11) above, and the lower alkyl group for $R^{11}$ is the same as the lower alkyl group for R. $R^{11}$ is preferably a methyl group or ethyl group, and an ethyl group is particularly desirable.

The weight average molecular weight (Mw) (the polystyrene equivalent value determined by gel permeation chromatography) of the resin (A2) is not particularly limited, but is preferably 2,000 to 50,000, more preferably 3,000 to 30,000, and most preferably 5,000 to 20,000. By making the weight average molecular weight no more than the upper limit of the above-mentioned range, the resin (A2) exhibits satisfactory solubility in a resist solvent when used as a resist. On the other hand, by making the weight average molecular weight at least as large as the lower limit of the above-mentioned range, dry etching resistance and cross-sectional shape of the resist pattern becomes satisfactory.

Further, the dispersity (Mw/Mn) is preferably 1.0 to 5.0, more preferably 1.0 to 3.0, and most preferably 1.2 to 2.5. Here, Mn is the number average molecular weight.

In the component (A), as the resin (A2), one type of resin may be used alone, or two or more types may be used in combination. It is particularly desirable that the resin (A2) includes two or more types of resins (i.e., the resin (A2) is a combination of two or more types).

In the component (A), the amount of the resin (A2) is preferably 10 to 80% by weight, more preferably 15 to 60% by weight, and most preferably 33 to 55% by weight.

When the amount of the resin (A2) is at least as large as the lower limit of the above-mentioned range, the effect of suppressing elution of a substance is enhanced. On the other hand, when the amount of the resin (A2) is no more than the upper limit of the above-mentioned range, a good balance can be achieved with the other resin (A1), which results in excellent lithography properties.

In the present invention, it is particularly desirable that the resin (A2) contains the resin (A2-1) and the resin (A2-2), as the effects of the present invention are significantly improved.

When the resin (A2) contains the resin (A2-1) and the resin (A2-2), the mixing ratio of the resin (A2-1) to the resin (A2-2) in terms of weight ratio is preferably 9:1 to 1:9, more preferably 8:2 to 2:8, and most preferably 8:2 to 5:5.

When the component (A) contains the resin (A1) and the resin (A2), the mixing ratio of the resin (A1) to the resin (A2) in terms of weight ratio is preferably 9:1 to 1:9, more preferably 8:2 to 2:8, and most preferably 6:4 to 4:6.

In the present invention, as the component (A), a resin containing a combination of the resin represented by general formula (A1-11) above, the resin represented by general formula (A2-1-11) above and the resin represented by general formula (A2-2-11) above is most preferably used.

The component (A) can be obtained, for example, by a conventional radical polymerization or the like of the monomers corresponding with each of the structural units, using a radical polymerization initiator such as azobisisobutyronitrile (AIBN).

Furthermore, in the component (A1), by using a chain transfer agent such as $HS\text{—}CH_2\text{—}CH_2\text{—}CH_2\text{—}C(CF_3)_2\text{—}OH$, a $\text{—}C(CF_3)_2\text{—}OH$ group can be introduced at the terminals of the component (A). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

Further, when the component (A) is a mixture, the component (A) can be obtained by polymerizing each of the polymers by the above-mentioned method and mixing the obtained polymers.

The weight average molecular weight (Mw) (the polystyrene equivalent value determined by gel permeation chromatography) of the entire component (A) is not particularly limited, but is preferably 2,000 to 50,000, more preferably 3,000 to 30,000, and most preferably 5,000 to 20,000. By making the weight average molecular weight no more than the upper limit of the above-mentioned range, the component (A) exhibits satisfactory solubility in a resist solvent when used as a resist. On the other hand, by making the weight average molecular weight at least as large as the lower limit of the above-mentioned range, dry etching resistance and cross-sectional shape of the resist pattern becomes satisfactory.

Further, the dispersity (Mw/Mn) is preferably 1.0 to 5.0, more preferably 1.0 to 3.0, and most preferably 1.2 to 2.5. Here, Mn is the number average molecular weight.

In the positive resist composition for immersion exposure according to the present invention, the amount of the component (A) can be adjusted depending on the thickness of the resist film to be formed, and the like.

<Component (B)>

As the component (B), there is no particular limitation, and any of the known acid generators used in conventional chemically amplified resist compositions can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

Examples of onium salt-based acid generators include compounds represented by general formula (b-0) shown below.

[Chemical Formula 30]

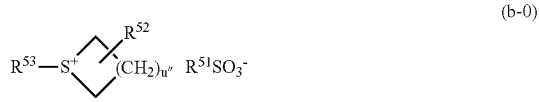
(b-0)

wherein $R^{51}$ represents a linear, branched or cyclic alkyl group, or a linear, branched or cyclic fluorinated alkyl group; $R^{52}$ represents a hydrogen atom, a hydroxyl group, a halogen atom, a linear or branched alkyl group, a linear or branched halogenated alkyl group, or a linear or branched alkoxy group; $R^{53}$ represents an aryl group which may have a substituent; and u" represents an integer of 1 to 3.

In general formula (b-0), $R^{51}$ represents a linear, branched or cyclic alkyl group, or a linear, branched or cyclic fluorinated alkyl group.

The linear or branched alkyl group preferably has 1 to 10 carbon atoms, more preferably 1 to 8 carbon atoms, and most preferably 1 to 4 carbon atoms.

The cyclic alkyl group preferably has 4 to 12 carbon atoms, more preferably 5 to 10 carbon atoms, and most preferably 6 to 10 carbon atoms.

The linear or branched fluorinated alkyl group preferably has 1 to 10 carbon atoms, more preferably 1 to 8 carbon atoms, and most preferably 1 to 4 carbon atoms. The cyclic fluorinated alkyl group preferably has 4 to 12 carbon atoms, more preferably 5 to 10 carbon atoms, and most preferably 6 to 10 carbon atoms. The fluorination ratio of the fluorinated alkyl group (percentage of the number of fluorine atoms substituting the hydrogen atoms within the alkyl group, based on the total number of hydrogen atoms within the alkyl group prior to fluorination) is preferably from 10 to 100%, more preferably from 50 to 100%, and it is particularly desirable that all of the hydrogen atoms are substituted with fluorine atoms, as the acid strength increases.

$R^{51}$ is most preferably a linear alkyl group or fluorinated alkyl group.

$R^{52}$ represents a hydrogen atom, a hydroxyl group, a halogen atom, a linear or branched alkyl group, a linear or branched halogenated alkyl group, or a linear or branched alkoxy group.

Examples of the halogen atom for $R^{52}$ include a fluorine atom, a bromine atom, a chlorine atom and an iodine atom, and a fluorine atom is preferable.

The alkyl group for $R^{52}$ is linear or branched, and preferably has 1 to 5 carbon atoms, more preferably 1 to 4 carbon atoms, and most preferably 1 to 3 carbon atoms.

The halogenated alkyl group for $R^{52}$ is a group in which some or all of the hydrogen atoms of the alkyl group have been substituted with halogen atoms. As the alkyl group of the halogenated alkyl group, the same as the alkyl group for $R^{52}$ may be exemplified. As the halogen atoms for substituting the hydrogen atoms of the alkyl group, the same as the halogen atom for $R^{52}$ may be exemplified. In the halogenated alkyl group, it is preferable that 50 to 100% of the hydrogen atoms of the alkyl group be substituted with halogen atoms, and it is more preferable that all of the hydrogen atoms are substituted with halogen atoms.

The alkoxy group for $R^{52}$ is linear or branched, and preferably has 1 to 5 carbon atoms, more preferably 1 to 4 carbon atoms, and most preferably 1 to 3 carbon atoms.

Among these, as $R^{52}$, a hydrogen atom is particularly desirable.

$R^{53}$ represents an aryl group which may have a substituent, preferably an aryl group of 6 to 20 carbon atoms, and examples of the basic ring excluding the substituent include a naphthyl group, a phenyl group and an anthracenyl group. In terms of the effects of the present invention and absorption of exposure ray such as ArF excimer laser, a phenyl group is preferable.

Examples of the substituent include a hydroxyl group and a lower alkyl group (linear or branched, and preferably has no more than 5 carbon atoms, and a methyl group is particularly desirable).

As the aryl group for $R^{53}$, those which do not have a substituent are preferable.

u" is an integer of 1 to 3, preferably 2 or 3, and it is particularly desirable that u" be 3.

As preferable examples of acid generators represented by general formula (b-0), the following can be exemplified.

[Chemical Formula 31]

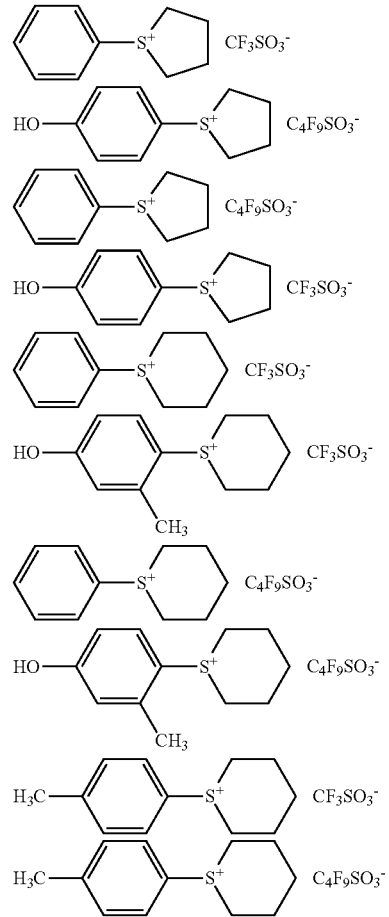

Examples of onium salt-based acid generators other than those represented by general formula (b-0) include compounds represented by general formula (b-1) or (b-2) shown below.

[Chemical Formula 32]

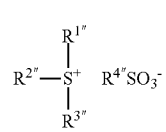
(b-1)

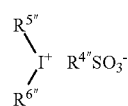
(b-2)

wherein $R^{1\prime\prime}$ to $R^{3\prime\prime}$, $R^{5\prime\prime}$ and $R^{6\prime\prime}$ each independently represents an aryl group or alkyl group; and $R^{4\prime\prime}$ represents a linear, branched or cyclic alkyl group or fluorinated alkyl group, with the proviso that at least one of $R^{1\prime\prime}$ to $R^{3\prime\prime}$ represents an aryl group, and at least one of $R^{5\prime\prime}$ and $R^6$, represents an aryl group.

In formula (b-1), $R^{1\prime\prime}$ to $R^{3\prime\prime}$ each independently represents an aryl group or an alkyl group. Among $R^{1\prime\prime}$ to $R^{3\prime\prime}$, at least one group represents an aryl group. Among $R^{1\prime\prime}$ to $R^{3\prime\prime}$, two or more groups are preferably aryl groups, and it is particularly desirable that all of $R^{1\prime\prime}$ to $R^{3\prime\prime}$ be aryl groups.

The aryl group for $R^{1\prime\prime}$ to $R^{3\prime\prime}$ is not specifically limited. For example, an aryl group having 6 to 20 carbon atoms may be used in which some or all of the hydrogen atoms of the aryl group may or may not be substituted with alkyl groups, alkoxy groups or halogen atoms. The aryl group is preferably an aryl group having 6 to 10 carbon atoms because it can be synthesized at a low cost. Specific examples thereof include a phenyl group and naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, and most preferably a methoxy group or an ethoxy group.

The halogen atom, with which hydrogen atoms of the aryl group may be substituted, is preferably a fluorine atom.

The alkyl group for $R^{1\prime\prime}$ to $R^{3\prime\prime}$ is not specifically limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and a methyl group is most preferable because it is excellent in resolution and can be synthesized at a low cost.

It is particularly desirable that each of $R^{1\prime\prime}$ to $R^{3\prime\prime}$ be a phenyl group or a naphthyl group.

$R^{4\prime\prime}$ represents a linear, branched or cyclic alkyl group or fluorinated alkyl group.

The linear or branched alkyl group preferably has 1 to 10 carbon atoms, more preferably 1 to 8 carbon atoms, and most preferably 1 to 4 carbon atoms.

The cyclic alkyl group is preferably a cyclic group, as described for $R^{1\prime\prime}$, having 4 to 15 carbon atoms, more preferably 4 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms.

Further, the fluorination ratio of the fluorinated alkyl group (ratio of fluorine atoms within the alkyl group) is preferably from 10 to 100%, more preferably from 50 to 100%, and it is particularly desirable that all hydrogen atoms are substituted with fluorine atoms because the acid strength increases.

$R^{4\prime\prime}$ is most preferably a linear or cyclic alkyl group or fluorinated alkyl group.

In formula (b-2), $R^{5\prime\prime}$ and $R^{6\prime\prime}$ each independently represents an aryl group or alkyl group. At least one of $R^{5\prime\prime}$ and $R^{6\prime\prime}$ represents an aryl group. It is preferable that both of $R^{5\prime\prime}$ and $R^{6\prime\prime}$ represent an aryl group.

As the aryl group for $R^{5\prime\prime}$ and $R^{6\prime\prime}$, the same as the aryl groups for $R^{1\prime\prime}$ to $R^{3\prime\prime}$ can be exemplified.

As the alkyl group for $R^{5\prime\prime}$ and $R^{6\prime\prime}$, the same as the alkyl groups for $R^{1\prime\prime}$ to $R^{3\prime\prime}$ can be exemplified.

It is particularly desirable that both of $R^{5\prime\prime}$ and $R^{6\prime\prime}$ represent a phenyl group.

As $R^{4\prime\prime}$ in formula (b-2), the same as those mentioned above for $R^{4\prime\prime}$ in formula (b-1) can be exemplified.

Specific examples of suitable onium salt-based acid generators represented by formula (b-1) or (b-2) include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, tri(4-tert-butyl)phenylsulfonium trifluoromethanesulfonate, heptafluoropropanesulfonate or nonafluorobutanesulfonate, diphenyl(1-(4-methoxy)naphthyl)sulfonium trifluoromethanesulfonate, heptafluoropropanesulfonate or nonafluorobutanesulfonate; and di(1-naphthyl)phenylsulfonium trifluoromethanesulfonate, heptafluoropropanesulfonate or nonafluorobutanesulfonate. It is also possible to use onium salts in which the anion moiety of these onium salts are replaced by methanesulfonate, n-propanesulfonate, n-butanesulfonate, or n-octanesulfonate.

Further, acid generators in which the anion moiety in general formula (b-1) or (b-2) is replaced with an anion moiety represented by general formula (b-3) or (b-4) shown below (the cation moiety is the same as (b-1) or (b-2)) may be used.

[Chemical Formula 33]

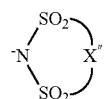

(b-3)

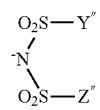

(b-4)

wherein X" represents an alkylene group of 2 to 6 carbon atoms in which at least one hydrogen atom has been substituted with a fluorine atom; and Y" and Z" each independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Y" and Z" each independently represents a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

The smaller the number of carbon atoms of the alkylene group of X" or those of the alkyl group of Y" and Z" within the range of the number of carbon atoms, the better the solubility in a resist solvent.

Further, in the alkylene group of X" or the alkyl group of Y" and Z", it is preferable that the number of hydrogen atoms substituted with fluorine atoms is as large as possible, as the acid strength increases, and the transparency to high energy radiation of 200 nm or less or electron beam is improved. The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

In the present description, an oximesulfonate-based acid generator is a compound having at least one group represented by general formula (B-1) shown below, and has a feature of generating acid by irradiation. Such oxime-sulfonate-based acid generators are widely used for a chemically amplified resist composition, and can be appropriately selected.

[Chemical Formula 34]

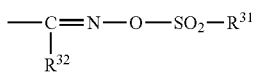

(B-1)

wherein $R^{31}$ and $R^{32}$ each independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The expression "having a substituent" means that some or all of the hydrogen atoms of the alkyl group or the aryl group are replaced with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ are the same as those of the alkyl group and the aryl group for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 35]

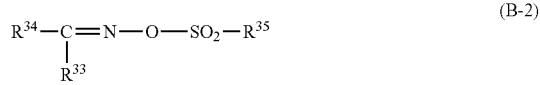

(B-2)

wherein $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 36]

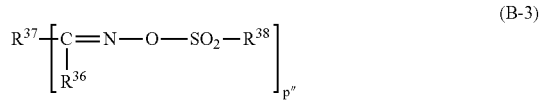

(B-3)

wherein $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As for the $R^{33}$, a halogenated alkyl group is preferable, and a fluorinated alkyl group is more preferable.

The fluorinated alkyl group for $R^{33}$ preferably has 50% or more of the hydrogen atoms of the alkyl group fluorinated, more preferably 70% or more, and still more preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthracyl group, and a phenantryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a partially or completely fluorinated alkyl group is more preferable.

In terms of enhancing the strength of the acid generated, the fluorinated alkyl group for $R^{35}$ preferably has 50% or more of the hydrogen atoms of the alkyl group fluorinated, more preferably 70% or more, still more preferably 90% or more. A completely fluorinated alkyl group in which 100% of the hydrogen atoms are substituted with fluorine atoms is particularly desirable.

In general formula (B-3), the alkyl group having no substituent and the halogenated alkyl group for $R^{36}$ are the same as the alkyl group having no substituent and the halogenated alkyl group for $R^{33}$.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may be preferably used.

Furthermore, as preferable examples, the following can be exemplified.

[Chemical Formula 37]

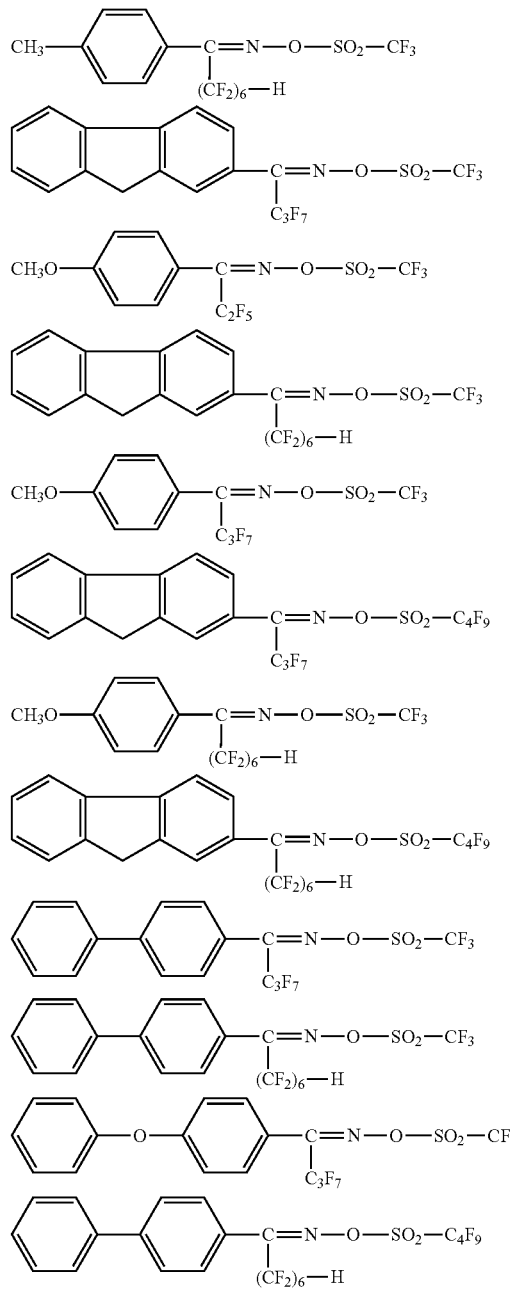

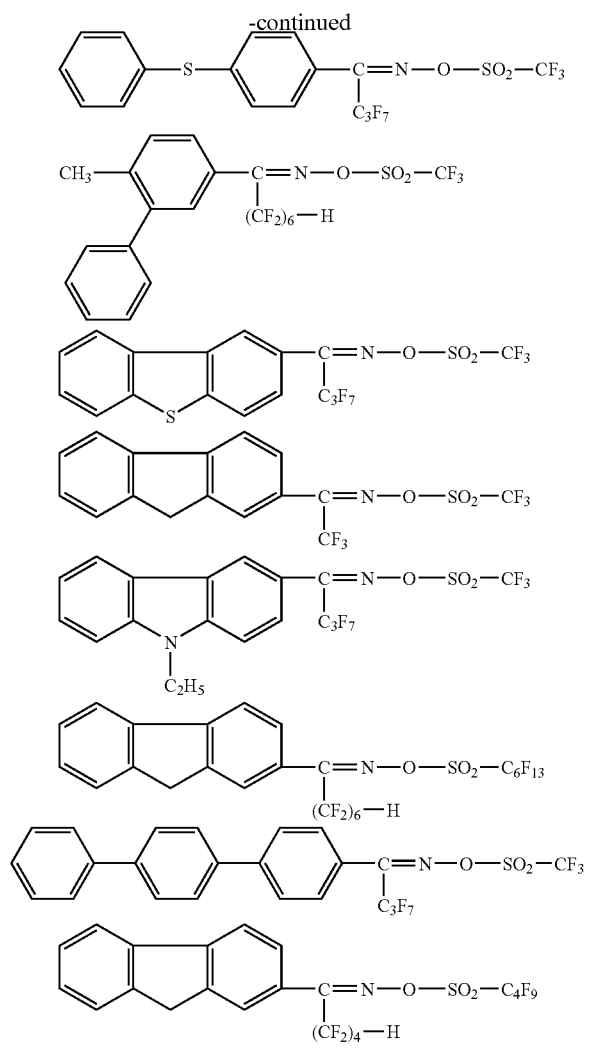

Among the above-exemplified compounds, the following 4 compounds are preferable.

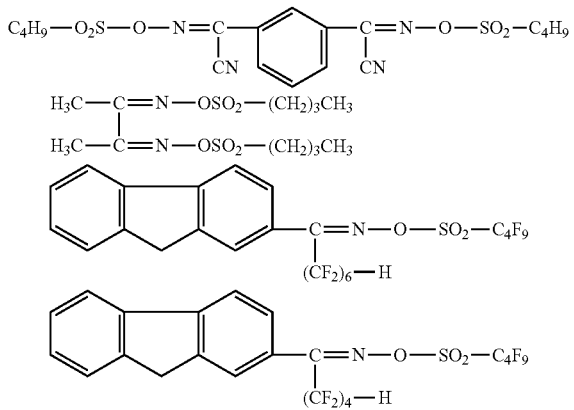

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethyl- sulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be exemplified.

As the component (B), one type of acid generator may be used, or two or more types may be used in combination.

In the present invention, as the component (B), it is preferable to use an onium salt having a fluorinated alkylsulfonic acid ion as the anion moiety. Specific example includes (4-methylphenyl)diphenylsulfonium nonafluorobutanesulfonate.

The amount of the component (B) within the positive resist composition for immersion exposure according to the present invention is typically 0.5 to 30 parts by weight, and preferably 1 to 10 parts by weight, relative to 100 parts by weight of the component (A). When the amount of the component (B) is within the above-mentioned range, formation of a resist pattern can be satisfactorily performed. Further, by virtue of the above-mentioned range, a uniform solution can be obtained and the storage stability becomes satisfactory.

<Component (D)>

In the positive resist composition for immersion exposure according to the present invention, for improving the resist pattern shape and the post exposure stability of the latent image formed by the pattern-wise exposure of the resist layer, it is preferable to add a nitrogen-containing organic compound (D) (hereafter referred to as the component (D)) as an optional component.

A multitude of these components (D) have already been proposed, and any of these known compounds may be used, although a cyclic amine, an aliphatic amine, and particularly a secondary aliphatic amine or tertiary aliphatic amine is preferable.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines). Specific examples of these aliphatic amines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkylalcoholamines such as diethanolamine, triethanolamine, diisopropanolamine, triisopropanolamine, di-n-octanolamine, and tri-n-octanolamine.

Among these, alkylalcoholamines and trialkylamines are preferable, and alkylalcoholamines are particularly desirable. Among alkylalcoholamines, triethanolamine and triisopropanolamine are preferable.

Examples of the cyclic amine include a heterocyclic compound containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

These compounds can be used either alone, or in combinations of two or more different compounds.

In the present invention, it is preferable to use an alkylalcoholamine as the component (D). Specific example includes triethanolamine.

The component (D) is typically used in an amount within a range from 0.01 to 5.0 parts by weight, relative to 100 parts by weight of the component (A).

<Optional Components>

Furthermore, in the positive resist composition for immersion exposure according to the present invention, for preventing any deterioration in sensitivity, and improving the resist pattern shape and the post exposure stability of the latent image formed by the pattern-wise exposure of the resist layer, an organic carboxylic acid, or a phosphorus oxo acid or derivative thereof (E) (hereafter referred to as the component (E)) can also be added as another optional component.

Examples of suitable organic carboxylic acids include acetic acid, malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid.

The component (E) is typically used in an amount within a range from 0.01 to 5.0 parts by weight, relative to 100 parts by weight of the component (A).

If desired, other miscible additives can also be added to the positive resist composition for immersion exposure according to the present invention. Examples of such miscible additives include additive resins for improving the performance of the resist film, surfactants for improving the applicability, dissolution inhibitors, plasticizers, stabilizers, colorants, halation prevention agents, and dyes.

The resist composition for immersion exposure according to the present invention can be prepared by dissolving the materials for the resist composition in an organic solvent (hereafter, frequently referred to as "component (S)").

The component (S) may be any organic solvent which can dissolve the respective components to give a uniform solution, and any one or more kinds of organic solvents can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-amyl ketone methyl isoamyl ketone, and 2-heptanone; polyhydric alcohols and derivatives thereof, such as ethylene glycol, diethylene glycol, propylene glycol and dipropylene glycol; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond; cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, amylbenzene, isopropylbenzene, toluene, xylene, cymene and mesitylene.

These solvents can be used individually, or in combination as a mixed solvent.

Among these, propylene glycol monomethyl ether acetate (PGMEA), propylene glycol monomethyl ether (PGME) and EL are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably from 1:9 to 9:1, more preferably from 2:8 to 8:2.

More specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate, depending on the thickness of the coating film. In general, the component (S) is used in an amount such that the solid content of the resist composition becomes within the range from 2 to 20% by weight, and preferably from 5 to 15% by weight.

Dissolving of the materials for a resist composition in the component (S) can be conducted by simply mixing and stirring each of the above components together using conventional methods, and where required, the composition may also be mixed and dispersed using a dispersion device such as a dissolver, a homogenizer, or a triple roll mill. Furthermore, following mixing, the composition may also be filtered using a mesh or a membrane filter or the like.

By the positive resist composition for immersion exposure according to the present invention, elution of a substance during immersion exposure can be suppressed, and excellent lithography properties can be obtained.

The reason why elution of a substance during immersion exposure can be suppressed has not been elucidated yet, but one of the main reasons is presumed that by virtue of the component (A) including the structural unit (a1) and the structural unit (a3), and the amount of the structural unit (a3) based on the combined total of all structural units constituting the component (A) being 3 to 12 mol %, the receding angle of the obtained resist film becomes large as compared to the case where a component (A) outside the scope of the present invention is used.

More specifically, the reason is presumed as follows. With respect to a resist film formed by using the positive resist composition for immersion exposure according to the present invention, the dynamic contact angle (the contact angle at which a water droplet starts to slide when the resist film is inclined, including the contact angle at the front-end point of the water droplet in the sliding direction (advancing angle) and the contact angle at the rear-end point of the water droplet in the sliding direction (receding angle)) changes, which is different from a resist composition in which a component (A) outside the scope of the present invention is used.

As described above, in an immersion exposure, the resist film comes into contact with an immersion medium such as water. Therefore, it is presumed that the elution of a substance from the resist is affected by the properties of the resist film surface (e.g., hydrophilicity and hydrophobicity).

In the present invention, it is presumed that by virtue of the amount of the structural unit (a3) within the component (A) being 3 to 12 mol %, the hydrophobicity of the resist film surface is enhanced as compared to the prior art, and the affinity with the immersion medium such as water is lowered. As a result, a resist film in which the elution of a substance from the resist film to the immersion medium is suppressed and which exhibits excellent lithography properties can be obtained.

As shown in FIG. 1, when a droplet 1 is placed on a plane 2 and the plane 2 is gradually inclined, the receding angle is the angle $\theta_1$ formed between the upper end 1a of the droplet 1 and the plane 2 as the droplet 1 starts to move (slide) on the plane 2.

In the FIGURE, $\theta_2$ indicates the sliding angle. The sliding angle is the inclination angle $\theta_2$ of the plane 2 as measured when the droplet 1 starts to move (slide) on the plane 2. As a result of experiments conducted by the present inventors, it was confirmed that the sliding angle generally tends to become smaller as the receding angle becomes larger.

In the present description, the receding angle is measured in the following manner.

First, a resist composition solution is spin-coated onto a silicone substrate having a diameter of 6 inches, and then heated at a temperature of 90° C. for 90 seconds to form a resist film.

Subsequently, with respect to the formed resist film, the receding angle can be measured by using commercially available measurement apparatuses such as AUTO SLIDING ANGLE: SA-30 DM (manufactured by Kyowa Interface Science Co. Ltd.), and AUTO DISPENSER: AD-31 (manufactured by Kyowa Interface Science Co. Ltd.).

With respect to the positive resist composition for immersion exposure according to the present invention, it is preferable that a resist film formed by using the positive resist composition have a receding angle of 45 degrees or more, more preferably 50 to 150 degrees, still more preferably 50 to 100 degrees, and most preferably 50 to 80 degrees.

When the receding angle is no more than 150 degrees, the lithography properties become excellent.

Further, when the receding angle is 45 degrees or more, the effect of suppressing the elution of a substance during the immersion exposure is enhanced. The reason for this has not been elucidated yet, but it is presumed that one of the main reasons is related to the hydrophobicity of the resist film. More specifically, it is presumed that since an aqueous substance such as water is used as the immersion medium, higher hydrophobicity has an influence on the swift removal of the immersion medium from the surface of the resist film after the immersion exposure.

The level of the receding angle can be adjusted by changing the amount of the structural unit (a3) within the component (A) and the mixing ratio of the resin (A1) to the resin (A2) within the component (A). In the present invention, the receding angle is increased by making the amount of the structural unit (a3) based on the combined total of all structural units constituting the component (A) 3 to 12 mol %.

As described above, the positive resist composition for immersion exposure according to the present invention is advantageous in that elution of a substance during immersion exposure is suppressed.

Further, the lithography properties are excellent. For example, the mask error factor (MEF) is excellent, a resist pattern faithful to the mask can be formed, and the mask reproducibility is excellent.

Furthermore, the process margin becomes large. For example, the fluctuation in the size of the resist pattern caused by the change in the bake temperature is small.

Moreover, the sensitivity and the depth of focus (DOF) are excellent, and a resist pattern having an excellent shape with surface roughness and generation of foreign substances suppressed can be formed.

Therefore, when the positive resist composition of the present invention is used as a resist for immersion exposure, a resist pattern can be formed without any practical problems.

The reason why the lithography properties are excellent has not been elucidated yet, but is presumed that by virtue of the elution of a substance being suppressed, deterioration of the resist and change in the refractive index of the immersion medium can be suppressed.

In addition, in the present invention, as a result of the elution of a substance during immersion exposure being suppressed, the level of contamination of the lens within the exposure apparatus can be lowered. Therefore, there is no need for protection against these disadvantages, and hence, the present invention can contribute to simplifying the process and the exposure apparatus.

<<Method of Forming a Resist Pattern>>

Next, the method of forming a resist pattern according to the present invention will be described.

The method of forming a resist pattern according to the present invention includes applying a positive resist composition for immersion exposure according to the present invention to a substrate to form a resist film on the substrate; subjecting the resist film to immersion exposure; and developing the resist film to form a resist pattern.

A preferable example of the method of forming a resist pattern according to the present invention will be described.

First, a positive resist composition for immersion exposure according to the present invention is applied to the surface of a substrate such as a silicon wafer using a spinner or the like, and a prebake (post applied bake (PAB) treatment) is performed, to thereby form a resist film.

An organic or inorganic anti-reflection film may be optionally provided between the substrate and the applied layer of the resist composition to form a double-layer laminate.

Alternatively, a double-layer laminate in which an organic anti-reflective film is provided on top of the resist film can be formed, or a triple-layer laminate further including an additional bottom layer anti-reflection film can be formed.

The anti-reflection film provided on top of the resist film is preferably soluble in an alkali developing solution.

The steps up until this point can be conducted by using conventional techniques. The operating conditions and the like are appropriately selected depending on the formulation and the characteristics of the positive resist composition for immersion exposure being used.

Subsequently, the obtained resist film is subjected to selective immersion exposure (liquid immersion lithography) through a desired mask pattern. At this time, the region between the resist film and the lens at the lowermost point of the exposure apparatus is pre-filled with a solvent (immersion medium) that has a larger refractive index than the refractive index of air, and the exposure (immersion exposure) is conducted in this state.

There are no particular limitations on the wavelength used for the exposure, and an ArF excimer laser, KrF excimer laser or $F_2$ laser or the like can be used. The resist composition according to the present invention is effective for KrF excimer lasers or ArF excimer lasers, and is particularly effective for ArF excimer lasers.

As described above, in a formation method of the present invention, during exposure, the region between the resist film and the lens at the lowermost point of the exposure apparatus is filled with an immersion medium, and exposure (immersion exposure) is conducted in this state.

The immersion medium preferably exhibits a refractive index larger than the refractive index of air, and about the same as the refractive index of the resist film formed from the positive resist composition for immersion exposure according to the present invention. The refractive index of the immersion medium is not particularly limited as long at it satisfies the above-mentioned requirements.

Examples of this immersion medium which exhibits a refractive index that is larger than the refractive index of air but smaller than the refractive index of the resist composition being used include water, fluorine-based inert liquids, and silicon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

A positive resist composition for immersion exposure according to the present invention is particularly resistant to any adverse effects caused by water, and because the resulting sensitivity and shape of the resist pattern profile are excellent, water is preferably used as the immersion medium which exhibits a refractive index that is larger than the refractive index of air. Furthermore, water is also preferred in terms of cost, safety, environmental friendliness, and versatility.

Subsequently, following completion of the immersion exposure step, post exposure baking (PEB) is conducted, and then a developing treatment is performed using an alkali developing liquid formed from an aqueous alkali solution. Thereafter, water rinse is preferably conducted with pure water. This water rinse is conducted by dripping or spraying water onto the surface of the substrate while rotating the substrate, and washes away the developing solution and those portions of the positive resist composition for immersion exposure that have been dissolved by the developing solution. By conducting a subsequent drying treatment, a resist pattern is obtained in which the resist film (coating of the positive resist composition for immersion exposure) has been patterned into a shape corresponding to the mask pattern.

EXAMPLES

As follows is a description of examples of the present invention, although the scope of the present invention is by no way limited by these examples.

<Synthesis of Resins>

Using monomers (1) to (4) shown below, resins (A)-1 to (A)-3 were synthesized by a conventional dropwise polymerization method. The weight average molecular weight (Mw), dispersity (Mw/Mn) and compositional ratio (molar ratio) of each of the resins are shown in Table 1.

The weight average molecular weight (Mw) and dispersity (Mw/Mn) were determined by the polystyrene equivalent value as measured by gel permeation chromatography (GPC). Further, the compositional ratio was determined by carbon NMR. In Table 1, (a1), (a2) and (a3) respectively indicate the structural units (a1), (a2) and (a3) used in the present invention.

TABLE 1

[Chemical Formula 39]

|  | (a1) | (a2) | (a3) |  |  |  |
|---|---|---|---|---|---|---|
| Resin | (1) | (2) | (3) | (4) | Mw | Mw/Mn |
| (A)-1 | 40 | 40 | — | 20 | 10000 | 2.0 |
| (A)-2 | 40 | 30 | 30 | — | 10000 | 2.0 |
| (A)-3 | 50 | 50 | — | — | 10000 | 2.0 |

The structures of resins (A)-1 to (A)-3 are shown below.

In the formulas, each of the subscript numerals at the lower right of the structural unit indicate the ratio (mol %) of the structural unit within the resin.

[Chemical Formula 40]

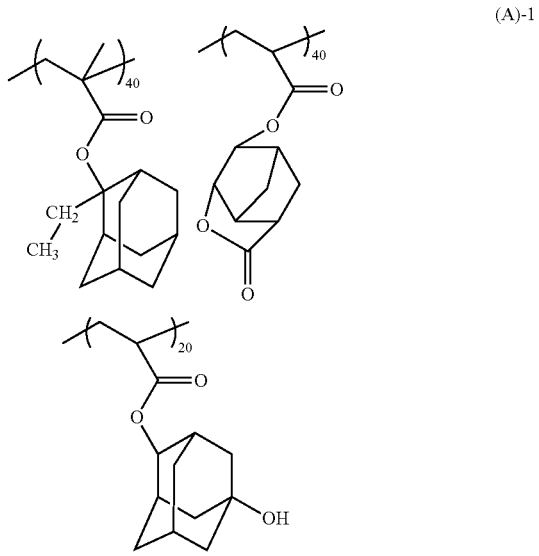

(A)-1

[Chemical Formula 41]

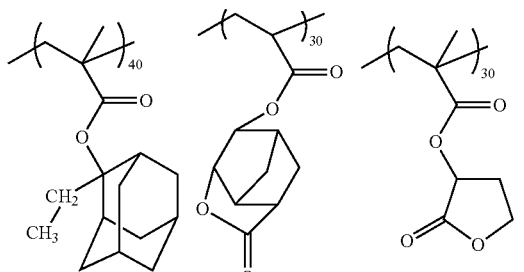

(A)-2

[Chemical Formula 42]

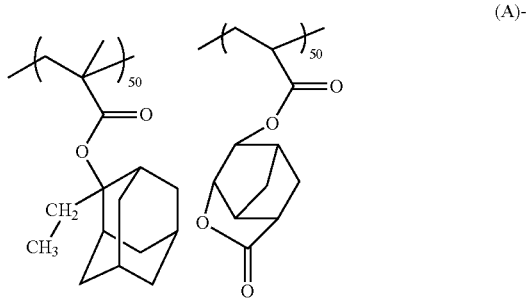

(A)-3

Preparation of Positive Resist Compositions for Immersion Exposure

Example 1 and Comparative Examples 1 to 3

The components shown in Table 2 were mixed together and dissolved to obtain positive resist composition solutions for immersion exposure (solid content: 7% by weight).

TABLE 2

| | Component (A) | | | Component (B) | Component (D) | Component (S) |
|---|---|---|---|---|---|---|
| Example 1 | (A)-1 [50] | (A)-2 [35] | (A)-3 [15] | (B)-1 [3.5] | (D)-1 [0.1] | (S)-1 [1300] |
| Comparative Example 1 | (A)-1 [100] | — | — | (B)-1 [3.5] | (D)-1 [0.1] | (S)-1 [1300] |
| Comparative Example 2 | — | (A)-2 [100] | — | (B)-1 [3.5] | (D)-1 [0.1] | (S)-1 [1300] |
| Comparative Example 3 | — | — | (A)-3 [100] | (B)-1 [3.5] | (D)-1 [0.1] | (S)-1 [1300] |

In Table 2, the reference characters indicate the following. Further, the values in brackets [ ] indicate the amount (in terms of parts by weight) of the component added.

With respect to the mixture of resin (A)-1, resin (A)-2 and resin (A)-3 used in Example 1, the average compositional ratio (1):(2):(3):(4) was 41.5:38:10.5:10 (molar ratio).

(B)-1: (4-methylphenyl)diphenylsulfonium nonafluorobutanesulfonate (D)-1: triethanolamine (S)-1: a mixed solvent of PGMEA/PGME=6/4 (weight ratio)

<Evaluation of the Effect of Suppressing Elution of a Substance>

Using the positive resist composition solutions for immersion exposure obtained in Example 1 and Comparative Examples 1 and 2, evaluations were performed as follows.

[Measurement of Receding Angle]

Each of the obtained positive resist composition solutions was applied onto an 8-inch silicon wafer using a spinner, and was prebaked on a hot plate at 115° C. for 60 seconds to thereby form a resist film having a thickness of 175 nm. Then, one droplet (50 µl) of pure water was dropped onto the resist film, and the receding angle (receding angle prior to exposure) was measured using the apparatus under conditions as described below.

(Name of Apparatus)
AUTO SLIDING ANGLE: SA-30 DM (manufactured by Kyowa Interface Science Co. Ltd.)
AUTO DISPENSER: AD-31 (manufactured by Kyowa Interface Science Co. Ltd.)
(Analysis Software (Attached to the Apparatus))
FAMAS Further, a resist film was formed in the same manner as described above, and the receding angle (receding angle after exposure) was measured in substantially the same manner as described above, except that an open frame exposure (exposure without a mask) was performed using a simple exposure apparatus VUVES4500 (manufactured by Lintec Japan Corporation) with an ArF excimer laser (193 nm). The measurement results of the receding angles of the resist film prior to and after exposure are shown in Table 3.

[Evaluation of Eluted Substance]

Using the positive resist composition solutions of Example 1 and Comparative Examples 1 and 2, resist films were formed in the same manner as described above.

Then, using VRC310S (manufactured by S.E.S CO., LTD.), one droplet of pure water (50 µl) was moved from the center of the wafer in a circular manner at room temperature at a constant linear velocity (area: 221.56 cm$^2$).

Thereafter, the droplet was collected, and analyzed by an analyzing apparatus Agilent-HP1100 LC-MSD (manufactured by Agilent Technologies), and the total amount of elution (mol/cm$^2$) of the cation moiety (PAG+) and anion moiety (PAG−) of the component (B) and the component (D) was determined. The results are shown in Table 3.

<Evaluation of Lithography Properties>

Using the positive resist composition solutions for immersion exposure of Example 1 and Comparative Examples 1 and 2, the lithography properties were evaluated.

An organic anti-reflection film composition (product name: ARC29, manufactured by Brewer Science Ltd.) was applied onto the surface of an 8-inch silicon wafer using a spinner, and the composition was then baked at 205° C. for 60 seconds, thereby forming an organic anti-reflection film having a thickness of 77 nm. The positive resist composition solution for immersion exposure obtained above was applied onto the surface of the anti-reflection film using a spinner, and was then prebaked (PAB) on a hotplate under PAB temperature and PAB time conditions indicated in Table 3 and dried, thereby forming a resist film having a film thickness of 250 nm.

Subsequently, the resist film was selectively irradiated with an ArF excimer laser (193 nm) through a mask pattern, using an ArF exposure apparatus NSR-S302 (manufactured by Nikon Corporation, NA (numerical aperture)=0.60, σ=0.75). Thereafter, a post exposure bake (PEB) treatment was conducted under the PEB temperature and PEB time conditions indicated in Table 3, followed by development at 23° C. in a 2.38% by weight aqueous solution of tetramethylammonium hydroxide under the time conditions indicated in Table 3. Then, the resist was rinsed for 30 seconds with pure water, followed by drying by shaking. As a result, a hole pattern with a hole diameter (aperture) of 140 nm and a pitch of 280 nm was formed.

[Evaluation of Sensitivity]

The optimum exposure dose (Eop) (unit: mJ/cm$^2$) at which a hole pattern with a hole diameter of 140 nm and a pitch of 280 nm was formed was determined. The results are shown in Table 3.

[Evaluation of Mask Error Factor (MEF)]

With the above-mentioned Eop, hole patterns were formed using a mask pattern targeting a hole pattern with a hole diameter (aperture) of 140 nm and a pitch of 280 nm and a mask pattern targeting a hole pattern with a hole diameter (aperture) of 160 nm and a pitch of 280 nm. With respect to the formed hole patterns, the MEF was determined by the following formula.

$$MEF = |CD_{160} - CD_{140}| / |MD_{160} - MD_{140}|$$

In this formula, $CD_{160}$ and $CD_{140}$ represent the respective hole diameters (nm) of the actual holes of the hole patterns respectively formed using the mask pattern targeting a hole diameter of 160 nm and the mask pattern targeting a hole diameter of 140 nm, and $MD_{160}$ and $MD_{140}$ represent the respective target hole diameters (nm), meaning $MD_{160}=160$ and $MD_{140}=140$. The results are shown in Table 3.

The MEF is a parameter that indicates how faithfully mask patterns of differing dimensions can be reproduced by using the same exposure dose with fixed pitch and changing the mask size (the hole diameter of a hole pattern). The closer the MEF value is to 1, the better the mask reproducibility.

[Evaluation of Resolution]

With the above-mentioned Eop, the pattern size was varied, and the minimum size of pattern which can be resolved was determined as the critical resolution (nm).

TABLE 3

| | | Ex. 1 | Comp. Ex. 1 | Comp. Ex. 2 | Comp. Ex. 3 |
|---|---|---|---|---|---|
| Receding angle (°) | Prior to exposure | 55.5 | 53.3 | 57.8 | — |
| | After exposure | 55.2 | 51.7 | 55.4 | — |
| Amount of elution ($\times 10^{-12}$) (mol/cm$^2$) | Prior to exposure | 14.73 | 30.11 | 10.73 | — |
| PAB | Temperature (° C.) | 115 | 120 | 90 | — |
| | Time (seconds) | 60 | 90 | 60 | — |
| PEB | Temperature (° C.) | 90 | 90 | 90 | — |
| | Time (seconds) | 60 | 90 | 60 | — |
| Development time | Time (seconds) | 60 | 90 | 60 | — |
| Eop (mJ/cm2) | | 35.8 | 60.9 | 26.9 | — |
| MEF | | 2.83 | 3.03 | 4.02 | — |
| Resolution (nm) | | 140 | 140 | 140 | — |

As shown by the results in Table 3, with respect to the receding angle, it was confirmed that both of the receding angles prior to and after exposure were large for the positive resist composition of Example 1 containing the component (A) within the scope of the present invention (component (A) including the structural unit (a3) in an amount within the scope of the present invention (10 mol %)), as compared to the positive resist composition of Comparative Example 1 containing only the resin (A)-1 as the component (A) which included the structural unit (a3) in an amount outside the scope of the present invention (20 mol %). Further, with respect to the difference between the receding angles prior to and after exposure, the difference in Example 1 was smaller than those in Comparative Examples 1 and 2.

With respect to the amount of elution, elution of the component (B) and the component (D) into the immersion medium (water) prior to immersion exposure was significantly suppressed in the positive resist composition of Example 1 containing the component (A) within the scope of the present invention, as compared to the positive resist composition of Comparative Example 1 containing a component (A) outside the scope of the present invention.

Therefore, from the results of the measurements of the receding angles and amounts of elution, it is apparent that increase in the receding angle correlates with the effect of suppressing elution of a substance. Further, it is presumed that the effect of suppressing elution of a substance has an influence on reducing the difference between the receding angles prior to and after exposure.

With respect to the lithography properties, the positive resist composition of Example 1 containing the component (A) within the scope of the present invention exhibited excellent resolution. Further, the positive resist composition of Example 1 containing the component (A) within the scope of the present invention exhibited excellent MEF as compared to the positive resist compositions of Comparative Examples 1 and 2 containing a component (A) outside the scope of the present invention. Therefore, it was confirmed that the positive resist composition of Example 1 exhibited excellent lithography properties.

On the other hand, in Comparative Example 2 in which only resin (A)-2 containing no structural unit (a3) was used as the component (A), the receding angle was large, and the amount of elution was small, so that the effect of suppressing elution of a substance was satisfactory. However, with respect to lithography properties, the MEF was poor. Therefore, it was confirmed that suppression of elution of a substance could not consist with lithography properties.

In Comparative Example 3 in which only resin (A)-3 containing no structural unit (a3) was used as the component (A), the resin (A)-3 could not be dissolved in the component (S), and a positive resist composition solution for immersion exposure could not be obtained. Therefore, evaluations of the effect of suppressing elution of a substance and lithography properties could not be performed.

Therefore, from the results shown in Table 3, it was confirmed that the positive resist composition of Example 1 containing the component (A) within the scope of the present invention was capable of suppressing elution of a substance during immersion exposure and exhibited excellent lithography properties.

INDUSTRIAL APPLICABILITY

The positive resist composition for immersion exposure according to the present invention is capable of suppressing elution of a substance during immersion exposure, and superior in various lithography properties. Therefore, the positive resist composition of the present invention is extremely useful for forming a resist film for immersion exposure.

The invention claimed is:

1. A positive resist composition for immersion exposure comprising a resin component (A) which has acid dissociable, dissolution inhibiting groups and exhibits increased alkali solubility under action of acid and an acid-generator component (B) which generates acid upon exposure, said resin component (A) comprising a structural unit (a1) derived from an acrylate ester having an acid dissociable, dissolution inhibiting group, a structural unit (a2)

derived from an acrylate ester having a lactone-containing cyclic group, and a structural unit (a3) derived from an acrylate ester having a polar group-containing aliphatic hydrocarbon group, wherein said resin component (A) comprises:
- a resin (A1) comprising said structural unit (a1), said structural unit (a2) and said structural unit (a3), and
- a resin (A2) comprising said structural unit (a1) and said structural unit (a2), and excluding said structural unit (a3), wherein
- the amount of said structural unit (a3) based on the combined total of all structural units constituting said resin component (A) is 3 to 12 mol %.

2. The positive resist composition for immersion exposure according to claim 1, wherein said resin (A2) comprises:
- a resin (A2-1) comprising said structural unit (a1), a structural unit (a2-01) derived from an acrylate ester having a lactone-containing polycyclic group and a structural unit (a2-02) derived from an acrylate ester having a lactone-containing monocyclic group, and
- a resin (A2-2) comprising said structural unit (a1) and said structural unit (a2-01).

3. The positive resist composition for immersion exposure according to claim 1, which further comprises a nitrogen-containing organic compound (D).

4. A method of forming a resist pattern, comprising: applying a positive resist composition for immersion exposure of any one of claims 1, 2 and 3 to a substrate to form a resist film on the substrate; subjecting said resist film to immersion exposure; and developing said resist film to form a resist pattern.

* * * * *

UNITED STATES PATENT AND TRADEMARK OFFICE
CERTIFICATE OF CORRECTION

PATENT NO. : 7,910,285 B2  
APPLICATION NO. : 12/162080  
DATED : March 22, 2011  
INVENTOR(S) : Hiroaki Shimizu Page 1 of 1

It is certified that error appears in the above-identified patent and that said Letters Patent is hereby corrected as shown below:

At Column 54, Line 48, Change "1 to" to --1 to 5--.

At Column 56, Line 9, Change "(a1))" to --(a1),--.

At Column 63, Line 3, Change "$R^6$," to --$R^{6''}$--.

At Column 66, Line 62, Change "anthracyl" to --anthracenyl--.

At Column 66, Line 63, Change "phenantryl" to --phenanthryl--.

Signed and Sealed this  
Twenty-seventh Day of September, 2011

David J. Kappos  
*Director of the United States Patent and Trademark Office*